(12) United States Patent
Cernea

(10) Patent No.: US 11,848,056 B2
(45) Date of Patent: Dec. 19, 2023

(54) QUASI-VOLATILE MEMORY WITH ENHANCED SENSE AMPLIFIER OPERATION

(71) Applicant: SUNRISE MEMORY CORPORATION, San Jose, CA (US)

(72) Inventor: Raul Adrian Cernea, Santa Clara, CA (US)

(73) Assignee: SUNRISE MEMORY CORPORATION, San Jose, CA (US)

(*) Notice: Subject to any disclaimer, the term of this patent is extended or adjusted under 35 U.S.C. 154(b) by 225 days.

(21) Appl. No.: 17/529,083

(22) Filed: Nov. 17, 2021

(65) Prior Publication Data

US 2022/0180943 A1 Jun. 9, 2022

Related U.S. Application Data

(60) Provisional application No. 63/122,841, filed on Dec. 8, 2020.

(51) Int. Cl.
*G11C 16/26* (2006.01)
*G11C 16/08* (2006.01)
*G11C 16/24* (2006.01)

(52) U.S. Cl.
CPC .............. *G11C 16/26* (2013.01); *G11C 16/08* (2013.01); *G11C 16/24* (2013.01)

(58) Field of Classification Search
CPC .................................................... G11C 16/26
See application file for complete search history.

(56) References Cited

U.S. PATENT DOCUMENTS

| 4,213,139 A | 7/1980 | Rao |
| 5,583,808 A | 12/1996 | Brahmbhatt |
| 5,646,886 A | 7/1997 | Brahmbhatt |
| 5,656,842 A | 8/1997 | Iwamatsu |

(Continued)

FOREIGN PATENT DOCUMENTS

| JP | 1998-269789 | 10/1998 |
| JP | 2010108522 A1 | 5/2010 |

(Continued)

OTHER PUBLICATIONS

"EP Extended Search Report EP168690149.3", dated Oct. 18, 2019.

(Continued)

*Primary Examiner* — Jason Lappas

(57) ABSTRACT

A semiconductor memory device is implemented as a string of storage transistors with sense amplifier connected drain terminals and floating source terminals. In some embodiments, a method in the semiconductor memory device applies a bit line control (BLC) voltage with a voltage step down to the bias device during the read operation to reduce the settling time on the bit line, thereby shortening the access time for data read out from the storage transistors. In other embodiments, a method in the semiconductor memory device including an array of strings of storage transistors uses a current from a biased but unselected bit line as the sense amplifier reference current for reading stored data from a selected bit line. In one embodiment, the sense amplifier reference current is provided to a referenced sense amplifier to generate a sense amplifier data latch signal.

24 Claims, 12 Drawing Sheets

(56) References Cited

U.S. PATENT DOCUMENTS

| | | |
|---|---|---|
| 5,768,192 A | 6/1998 | Eitan |
| 5,789,776 A | 8/1998 | Lancaster et al. |
| 5,915,167 A | 6/1999 | Leedy |
| 6,040,605 A | 3/2000 | Sano et al. |
| 6,107,133 A | 8/2000 | Furukawa |
| 6,118,171 A | 9/2000 | Davies et al. |
| 6,130,838 A | 10/2000 | Kim et al. |
| 6,314,046 B1 | 11/2001 | Kamiya et al. |
| 6,362,508 B1 | 3/2002 | Rasovaky et al. |
| 6,434,053 B1 | 8/2002 | Fujiwara |
| 6,580,124 B1 | 6/2003 | Cleeves et al. |
| 6,744,094 B2 | 6/2004 | Forbes |
| 6,774,458 B2 | 8/2004 | Fricke et al. |
| 6,873,004 B1 | 3/2005 | Han et al. |
| 6,881,994 B2 | 4/2005 | Lee et al. |
| 6,946,703 B2 | 9/2005 | Ryu et al. |
| 7,005,350 B2 | 2/2006 | Walker et al. |
| 7,223,653 B2 | 5/2007 | Cheng et al. |
| 7,307,308 B2 | 12/2007 | Lee |
| 7,426,141 B2 | 9/2008 | Takeuchi |
| 7,489,002 B2 | 2/2009 | Forbes et al. |
| 7,495,963 B2 | 2/2009 | Edahiro et al. |
| 7,524,725 B2 | 4/2009 | Chung |
| 7,542,348 B1 | 6/2009 | Kim |
| 7,612,411 B2 | 11/2009 | Walker |
| 7,876,614 B2 | 1/2011 | Kang et al. |
| 8,026,521 B1 | 9/2011 | Or-Bach et al. |
| 8,139,418 B2 | 3/2012 | Carman |
| 8,178,396 B2 | 5/2012 | Sinha et al. |
| 8,278,183 B2 | 10/2012 | Lerner |
| 8,395,942 B2 | 3/2013 | Samachisa et al. |
| 8,630,114 B2 | 1/2014 | Lue |
| 8,767,473 B2 | 7/2014 | Shim et al. |
| 8,848,425 B2 | 9/2014 | Schloss |
| 8,878,278 B2 | 11/2014 | Alsmeier et al. |
| 9,158,622 B2 | 10/2015 | Lee et al. |
| 9,190,293 B2 | 11/2015 | Wang et al. |
| 9,202,694 B2 | 12/2015 | Konevecki et al. |
| 9,230,985 B1 | 1/2016 | Wu et al. |
| 9,412,752 B1 | 8/2016 | Yeh et al. |
| 9,455,268 B2 | 9/2016 | Oh et al. |
| 9,620,605 B2 | 4/2017 | Liang et al. |
| 9,633,944 B2 | 4/2017 | Kim |
| 9,748,172 B2 | 8/2017 | Takaki |
| 9,799,761 B2 | 10/2017 | Or-Bach et al. |
| 9,842,651 B2 | 12/2017 | Harari |
| 9,892,800 B2 | 2/2018 | Harari |
| 9,911,497 B1 | 3/2018 | Harari |
| 10,074,667 B1 | 9/2018 | Higashi |
| 10,096,364 B2 | 10/2018 | Harari |
| 10,121,553 B2 | 11/2018 | Harari |
| 10,157,780 B2 | 12/2018 | Wu et al. |
| 10,249,370 B2 | 4/2019 | Harari |
| 10,254,968 B1 | 4/2019 | Gazit et al. |
| 10,283,493 B1 | 5/2019 | Nishida |
| 10,373,956 B2 | 8/2019 | Gupta et al. |
| 10,381,370 B2 | 8/2019 | Shin et al. |
| 10,381,378 B1 | 8/2019 | Harari |
| 10,395,737 B2 | 8/2019 | Harari |
| 10,431,596 B2 | 10/2019 | Herner et al. |
| 10,475,812 B2 | 11/2019 | Harari |
| 10,622,377 B2 | 4/2020 | Harari et al. |
| 10,651,153 B2 | 5/2020 | Fastow et al. |
| 10,692,874 B2 | 6/2020 | Harari et al. |
| 2001/0030340 A1 | 10/2001 | Fujiwara |
| 2001/0053092 A1 | 12/2001 | Kosaka et al. |
| 2002/0012271 A1 | 1/2002 | Forbes |
| 2002/0028541 A1 | 3/2002 | Lee et al. |
| 2002/0051378 A1 | 5/2002 | Ohsawa |
| 2002/0193484 A1 | 12/2002 | Albee |
| 2003/0038318 A1 | 2/2003 | Forbes |
| 2004/0214387 A1 | 10/2004 | Madurawe et al. |
| 2004/0246807 A1 | 12/2004 | Lee |
| 2004/0262681 A1 | 12/2004 | Masuoka et al. |
| 2004/0262772 A1 | 12/2004 | Ramanathan et al. |
| 2004/0264247 A1 | 12/2004 | Kim |
| 2005/0128815 A1 | 6/2005 | Ishikawa et al. |
| 2005/0280061 A1 | 12/2005 | Lee |
| 2006/0001083 A1 | 1/2006 | Bhattacharyya |
| 2006/0155921 A1 | 7/2006 | Gorobets et al. |
| 2007/0045711 A1 | 3/2007 | Bhattacharyya |
| 2007/0134876 A1 | 6/2007 | Lai et al. |
| 2008/0178794 A1 | 7/2008 | Cho et al. |
| 2008/0239812 A1 | 10/2008 | Naofumi et al. |
| 2008/0301359 A1 | 12/2008 | Smith |
| 2009/0057722 A1 | 3/2009 | Masuoka et al. |
| 2009/0157946 A1 | 6/2009 | Arya |
| 2009/0237996 A1 | 9/2009 | Kirsch et al. |
| 2009/0279360 A1 | 11/2009 | Peter et al. |
| 2009/0290442 A1 | 11/2009 | Rajan |
| 2009/0316487 A1 | 12/2009 | Lee et al. |
| 2010/0121994 A1 | 5/2010 | Kim et al. |
| 2010/0124116 A1 | 5/2010 | Takashi et al. |
| 2010/0128509 A1 | 5/2010 | Kim et al. |
| 2010/0219392 A1 | 9/2010 | Awaya et al. |
| 2010/0254191 A1 | 10/2010 | Son et al. |
| 2011/0044113 A1 | 2/2011 | Kim |
| 2011/0115011 A1 | 5/2011 | Masuoka et al. |
| 2011/0134705 A1 | 6/2011 | Jones et al. |
| 2011/0170266 A1 | 7/2011 | Haensh et al. |
| 2011/0208905 A1 | 8/2011 | Shaeffer et al. |
| 2011/0298013 A1 | 12/2011 | Hwang et al. |
| 2011/0310683 A1 | 12/2011 | Gorobets |
| 2012/0182801 A1 | 7/2012 | Lue |
| 2012/0243314 A1 | 9/2012 | Takashi |
| 2012/0307568 A1 | 12/2012 | Banna et al. |
| 2013/0031325 A1 | 1/2013 | Nakamoto et al. |
| 2013/0256780 A1 | 10/2013 | Kai et al. |
| 2014/0015036 A1 | 1/2014 | Fursin et al. |
| 2014/0040698 A1 | 2/2014 | Loh et al. |
| 2014/0075135 A1 | 3/2014 | Choi et al. |
| 2014/0117366 A1 | 5/2014 | Saitoh |
| 2014/0151774 A1 | 6/2014 | Rhie |
| 2014/0229131 A1 | 8/2014 | Cohen et al. |
| 2014/0247674 A1 | 9/2014 | Karda et al. |
| 2014/0328128 A1 | 11/2014 | Louie et al. |
| 2014/0340952 A1 | 11/2014 | Ramaswamy et al. |
| 2015/0054507 A1 | 2/2015 | Gulaka et al. |
| 2015/0098272 A1 | 4/2015 | Kasolra et al. |
| 2015/0113214 A1 | 4/2015 | Sutardja |
| 2015/0155876 A1 | 6/2015 | Jayasena et al. |
| 2015/0194440 A1 | 7/2015 | Noh et al. |
| 2015/0249143 A1 | 9/2015 | Sano |
| 2015/0263005 A1 | 9/2015 | Zhao et al. |
| 2015/0372099 A1 | 12/2015 | Chen et al. |
| 2016/0013156 A1 | 1/2016 | Zhai et al. |
| 2016/0019951 A1 | 1/2016 | Park et al. |
| 2016/0035711 A1 | 2/2016 | Hu |
| 2016/0086970 A1 | 3/2016 | Peng |
| 2016/0225860 A1 | 8/2016 | Karda et al. |
| 2016/0300724 A1 | 10/2016 | Levy et al. |
| 2016/0314042 A1 | 10/2016 | Plants |
| 2017/0092370 A1 | 3/2017 | Harari |
| 2017/0092371 A1 | 3/2017 | Harari |
| 2017/0148517 A1 | 5/2017 | Harari |
| 2017/0148810 A1 | 5/2017 | Kai et al. |
| 2017/0213821 A1 | 7/2017 | Or-Bach et al. |
| 2017/0358594 A1 | 12/2017 | Lu et al. |
| 2018/0095127 A1 | 4/2018 | Pappu et al. |
| 2018/0108416 A1 | 4/2018 | Harari |
| 2018/0269229 A1 | 9/2018 | Or-Bach et al. |
| 2018/0331042 A1 | 11/2018 | Manusharow et al. |
| 2018/0366471 A1 | 12/2018 | Harari et al. |
| 2018/0366485 A1 | 12/2018 | Harari |
| 2018/0366489 A1 | 12/2018 | Harari et al. |
| 2019/0006009 A1 | 1/2019 | Harari |
| 2019/0019564 A1 | 1/2019 | Li et al. |
| 2019/0067327 A1 | 2/2019 | Herner et al. |
| 2019/0157296 A1 | 5/2019 | Harari et al. |
| 2019/0180821 A1 | 6/2019 | Harari |
| 2019/0206890 A1 | 7/2019 | Harari et al. |
| 2019/0214077 A1 | 7/2019 | Oh et al. |
| 2019/0238134 A1 | 8/2019 | Lee et al. |
| 2019/0244971 A1 | 8/2019 | Harari |

(56) References Cited

U.S. PATENT DOCUMENTS

| | | |
|---|---|---|
| 2019/0259769 A1 | 8/2019 | Karda et al. |
| 2019/0303042 A1 | 10/2019 | Kim et al. |
| 2019/0325945 A1 | 10/2019 | Linus |
| 2019/0325964 A1 | 10/2019 | Harari |
| 2019/0319044 A1 | 11/2019 | Harari |
| 2019/0348424 A1 | 11/2019 | Karda et al. |
| 2019/0355747 A1 | 11/2019 | Herner et al. |
| 2019/0370117 A1 | 12/2019 | Fruchtman et al. |
| 2020/0034697 A1* | 1/2020 | Choi .................. G06N 3/08 |
| 2020/0051990 A1 | 2/2020 | Harari et al. |
| 2020/0098738 A1 | 3/2020 | Herner et al. |
| 2020/0098779 A1 | 3/2020 | Cernea et al. |
| 2020/0176468 A1 | 6/2020 | Herner et al. |
| 2020/0258897 A1 | 8/2020 | Yan et al. |

FOREIGN PATENT DOCUMENTS

| | | |
|---|---|---|
| JP | 2011028540 A1 | 2/2011 |
| KR | 20120085591 A1 | 8/2012 |
| KR | 20120085603 A | 8/2012 |
| WO | 2015025357 A1 | 2/2015 |
| WO | 2018236937 A1 | 12/2018 |

OTHER PUBLICATIONS

"European Search Report, EP 16852238.1", dated Mar. 28, 2019.
"European Search Report, EP17844550.8", dated Aug. 12, 2020, 11 pages.
"Invitation to Pay Additional Fees (PCT/ISA/206), PCT/US2020/015710", dated Mar. 20, 2020, 2 pages.
"Notification of Reasons for Refusal, Japanese Patent Application 2018-527740", dated Nov. 4, 2020, 8 pages.
"Partial European Search Report EP 16869049.3", dated Jul. 1, 2019, pp. 1-12.
"PCT Search Report and Written Opinion, PCT/US2018/038373", dated Sep. 10, 2018.
"PCT Search Report and Written Opinion, PCT/US2019/014319", dated Apr. 15, 2019.
"PCT Search Report and Written Opinion, PCT/US2019/052164", dated Feb. 27, 2020.
"PCT Search Report and Written Opinion, PCT/US2019/052446", dated Dec. 11, 2019.
"PCT Search Report and Written Opinion, PCT/US2020/015710", dated Jun. 9, 2020.
"PCT Search Report and Written Opinion, PCT/US2020/017494", dated Jul. 20, 2020, 13 pages.
"PCT Search Report and Written Opinion, PCT/US2020/065374", dated Mar. 15, 2021, 17 pages.
"PCT Search Report and Written Opinion, PCT/US2020/065670", dated Apr. 5, 2021, 12 pages.
"PCT Search Report and Written Opinion, PCT/US2021/016964", dated Jun. 15, 2021, 19 pages.
"PCT Search Report and Written Opinion, PCT/US2021/025722", dated Jun. 15, 2021, 10 pages.
Hou, S. Y., et al., "Wafer-Leval Integration of an Advanced Logic-Memory System Through the Second-Generation CoWoS Technology", IEEE Transactions on Electron Devices, vol. 64, No. 10, Oct. 2017, 4071-4077.
Kim, N., et al., "Multi-layered Vertical gate NANO Flash Overcoming Stacking Limit for Terabit Density Storage", Symposium on VLSI Tech. Dig. of Technical Papers, 2009, pp. 188-189.
Lue, H.T., et al., "A Highly Scalable 8- Layer 3D Vertical-gate {Vg} TFT NANO Flash Using Junction-Free Buried Channel BE-SONOS Device", Symposium on VLSI: Tech. Dig. Of Technical Papers, 2010, pp. 131-132.
Tanaka, T., et al., "A 768 GB 3b/cell 3D-Floaling-Gate NANO Flash Memory", Digest of Technical Papers, the 2016 IEEE International Solid-Slate Circuits Conference, 2016, pp. 142-144.
Wann, H.C., et al., "High-Endurance Ultra-Thin Tunnel Oxide in Monos Device Structure for Dynamic Memory Application", IEEE Electron Device letters, vol. 16, No. 11, Nov. 1995, pp. 491-493.

* cited by examiner

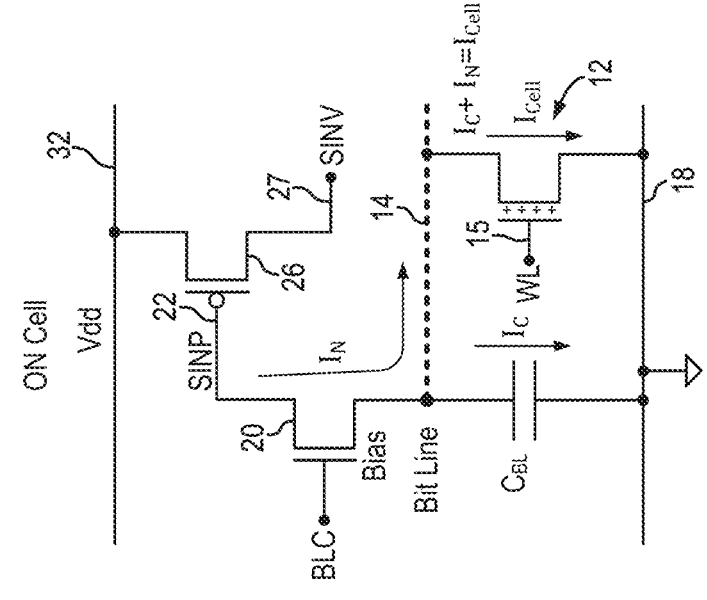
FIG. 4(c)
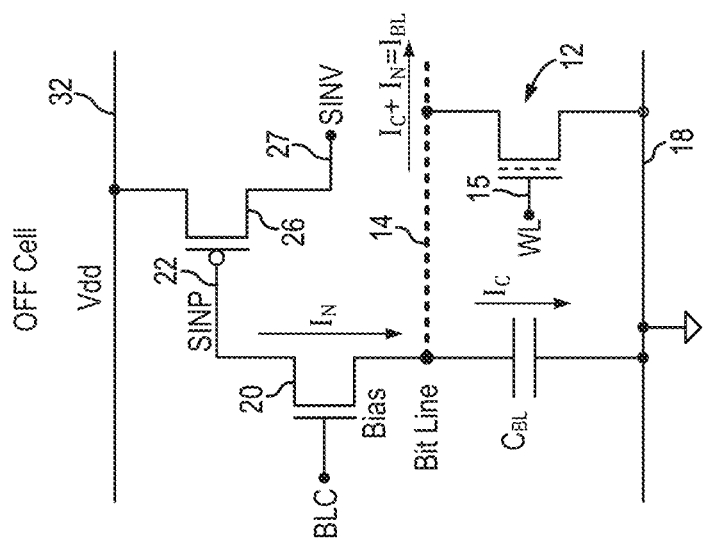
FIG. 4(b)
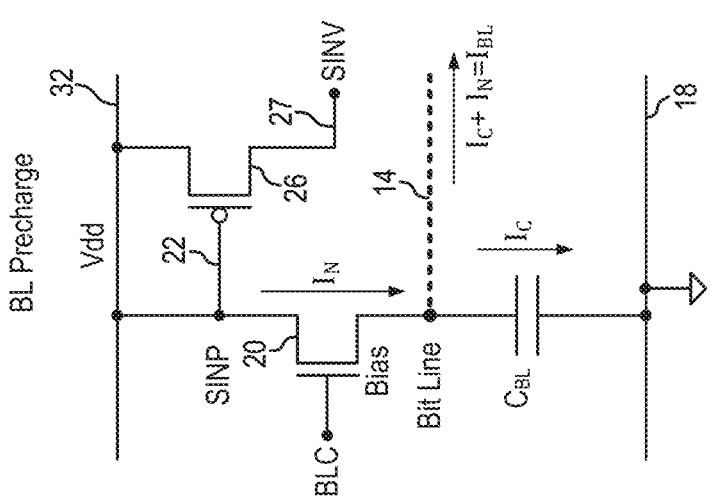
FIG. 4(a)
FIG. 4

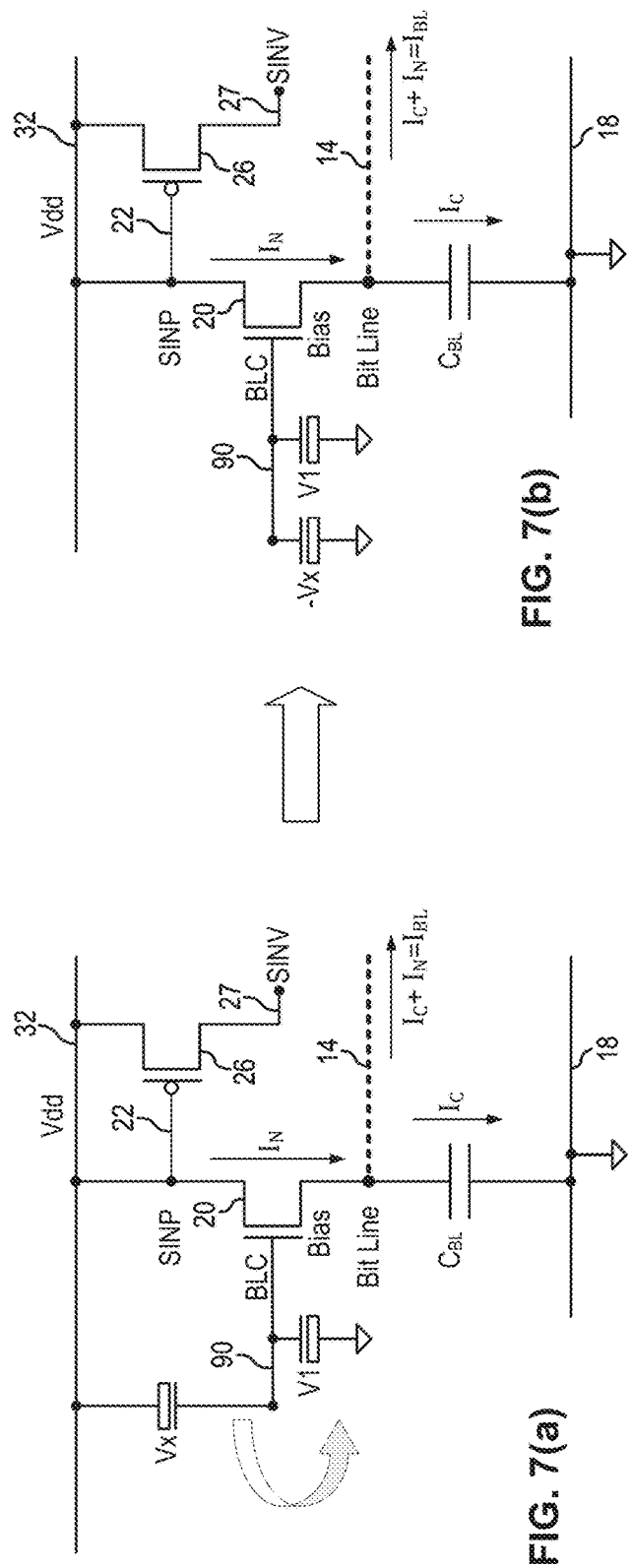
FIG. 7(a)
FIG. 7(b)
FIG. 7
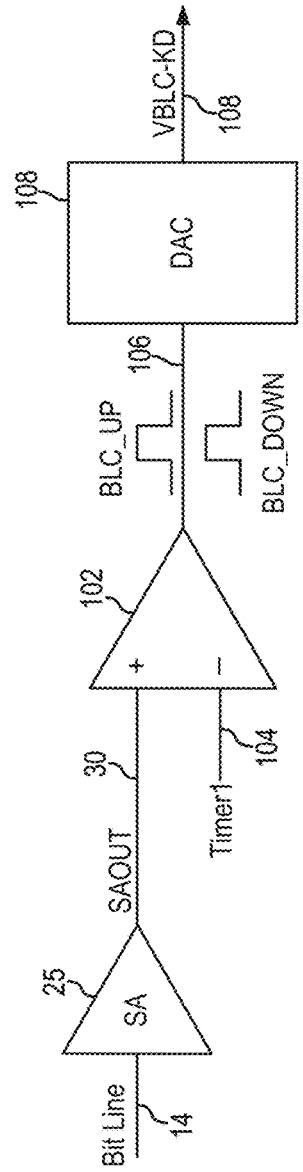
FIG. 8

QUASI-VOLATILE MEMORY WITH ENHANCED SENSE AMPLIFIER OPERATION

CROSS REFERENCE TO RELATED APPLICATIONS

This application claims priority to U.S. Provisional Patent Application No. 63/122,841, entitled Quasi-Volatile Memory with Enhanced Bitline Access and Enhanced Sense Amplifier Operation, filed Dec. 8, 2020, which is incorporated herein by reference for all purposes.

FIELD OF THE INVENTION

The present invention relates to semiconductor memory circuits and methods. More specifically, the present invention relates to semiconductor memory integrated circuits with enhanced bit line access; and alternately, the present invention relates to semiconductor memory integrated circuits with enhanced sense amplifier operation.

BACKGROUND OF THE INVENTION

U.S. Pat. No. 10,121,553 ("the '553 patent"), entitled "Capacitive-Coupled Non-Volatile Thin-film Transistor NOR Strings in Three-Dimensional Arrays," filed on Aug. 26, 2016, and issued on Nov. 6, 2018, discloses storage or memory transistors organized as 3-dimensional arrays of NOR strings formed above a planar surface of a semiconductor substrate. In the '553 patent, a NOR memory string includes numerous thin-film storage transistors that share a common bit line and a common source line. In one implementation, storage transistors in a NOR memory string are arranged along a direction (a "horizontal direction") that is substantially parallel to the planar surface of the semiconductor substrate. In such a 3-dimensional array, the NOR memory strings are provided on multiple planes (e.g., 8 or 16 planes) above the semiconductor substrate, with the NOR memory strings on each plane arranged in rows and one or more columns along two orthogonal horizontal directions. Data is stored in a charge storage film (e.g., a silicon oxide-silicon nitride-silicon oxide triple layer) in each storage transistor. The '553 patent is hereby incorporated by reference in its entirety for all purposes.

In the '553 patent, each storage transistor of a NOR memory string is read, programmed or erased by suitably biasing its associated word line and the common bit line it shares with other storage transistors in the NOR memory string. The storage transistor's associated word line is shared with storage transistors of NOR memory strings on other planes that are aligned with the storage transistor along the direction normal to the planar surface of the semiconductor substrate ("vertical direction"). Each word line may also be shared between two storage transistors from adjacent NOR memory strings on the same plane. During read, programming or erase operations, the common source line of the NOR memory string is typically provided a relatively constant voltage that is maintained either by a voltage source or by the charge in an associated capacitor ("virtual ground"), such as the parasitic capacitance of the common source line. To program or erase the storage transistor, for example, a substantial voltage difference (e.g., 8 volts) is imposed across the common bit line and the word line.

Various aspects of the read, program or erase operation of the NOR memory string can be optimized to enhance the performance of the NOR memory string.

SUMMARY OF THE INVENTION

In some embodiments, a method for sensing data from storage transistors in a memory device, the storage transistors being implemented as a string of storage transistors with drain terminals connected to a bit line and source terminals that are floating, the method includes: coupling the bit line to a first current terminal of a bias device, a second current terminal of the bias device being coupled to a sense node, the sense node being coupled to an input node of a sense amplifier and being switchably connected to a first power supply voltage; connecting the second current terminal of the bias device to the first power supply voltage and applying a first voltage to a control terminal of the bias device to turn on the bias device to pre-charge the bit line; after a first time duration, applying a second voltage to the control terminal of the bias device, the second voltage being lower than the first voltage; selecting a storage transistor from the string of storage transistors for access; after a second time duration, disconnecting the second current terminal of the bias device from the first power supply voltage and in response to the disconnecting, sensing, at the sense node, a data value of the selected storage transistor; and in response to an end of a sensing period, latching, at an output node of the sense amplifier, the sensed data value for the selected storage transistor.

In other embodiments, a method for sensing data from storage transistors in a memory device being implemented as an array of strings of storage transistors, each string of storage transistors having drain terminals connected to a bit line and source terminals that are floating, the method includes: biasing, using a first bias device, a first bit line associated with a first string of storage transistors to a precharge voltage value, the first bit line being coupled through the first bias device to an input node of a first sense amplifier; selecting a storage transistor from the first string of storage transistors for access; terminating the precharging of the first bit line; in response to the precharging being terminated, sensing, at the input node of the first sense amplifier, a data value of the selected storage transistor; generating, at an unselected bit line associated with a second string of storage transistors, a reference current in response to the unselected bit line being biased by a second bias device, the unselected bit line having no storage transistor being selected for access, the reference current being applied to indicate an end of a sensing period; and in response to the reference current indicating the end of the sensing period, latching, at an output node of the first sense amplifier, the sensed data value for the selected storage transistor from the first string of storage transistors.

These and other advantages, aspects and novel features of the present disclosure, as well as details of an illustrated embodiment thereof, will be more fully understood from the following description and drawings.

BRIEF DESCRIPTION OF THE DRAWINGS

Various embodiments of the invention are disclosed in the following detailed description and the accompanying drawings. Although the drawings depict various examples of the invention, the invention is not limited by the depicted examples. It is to be understood that, in the drawings, like reference numerals designate like structural elements. Also, it is understood that the depictions in the figures are not necessarily to scale.

FIG. 3(a) and FIG. 3(b), illustrates further the read operation for a selected storage transistor in the string of storage transistors of FIG. 1 in some embodiments.

FIG. 4, which includes FIGS. 4(a) to 4(c), illustrates in more details the read operation for a selected storage transistor in the string of storage transistors of FIG. 1 in some embodiments.

FIGS. 6(a) to 6(c), illustrates the circuit diagram and the signal waveforms for the BLC voltage kick down method in embodiments of the present disclosure.

FIG. 7, which includes FIGS. 7(a) and 7(b), illustrates one method of applying the BLC voltage kick down in embodiments of the present disclosure.

FIG. 8 is a circuit diagram of a calibration circuit which can be used to calibrate the BLC kick down voltage amplitude in embodiments of the present disclosure.

DETAILED DESCRIPTION OF THE INVENTION

In embodiments of the present disclosure, a semiconductor memory device is implemented as a string of storage transistors with sense amplifier connected drain terminals and floating source terminals. More specifically, the storage transistors' drain terminals are connected to a bit line biased by a bias device. In some embodiments, a method in the semiconductor memory device applies a bit line control (BLC) voltage with a voltage step down to the bias device during the read operation to reduce the settling time on the bit line, thereby shortening the access time for data read out from the storage transistors. In the present description, the method is sometimes referred to as BLC kick-down, referring to the stepping down of the bit line control voltage during the read operation.

In other aspects of the present disclosure, a method in the semiconductor memory device including an array of strings of storage transistors uses a current from a biased but unselected bit line as the sense amplifier reference current for reading stored data from a selected bit line. In one embodiment, the sense amplifier reference current is derived from the displacement current flowing in the biased but unselected bit line. As thus configured, an accurate and consistent sense amplifier reference current is provided. The sense amplifier reference current is provided to a referenced sense amplifier to generate a sense amplifier data latch signal. The sense amplifier reference current compensates for local variations of the storage transistors, such as leakage currents, thereby enhancing the accuracy and the reliability of the sense operation in the semiconductor memory device.

Figure 1:
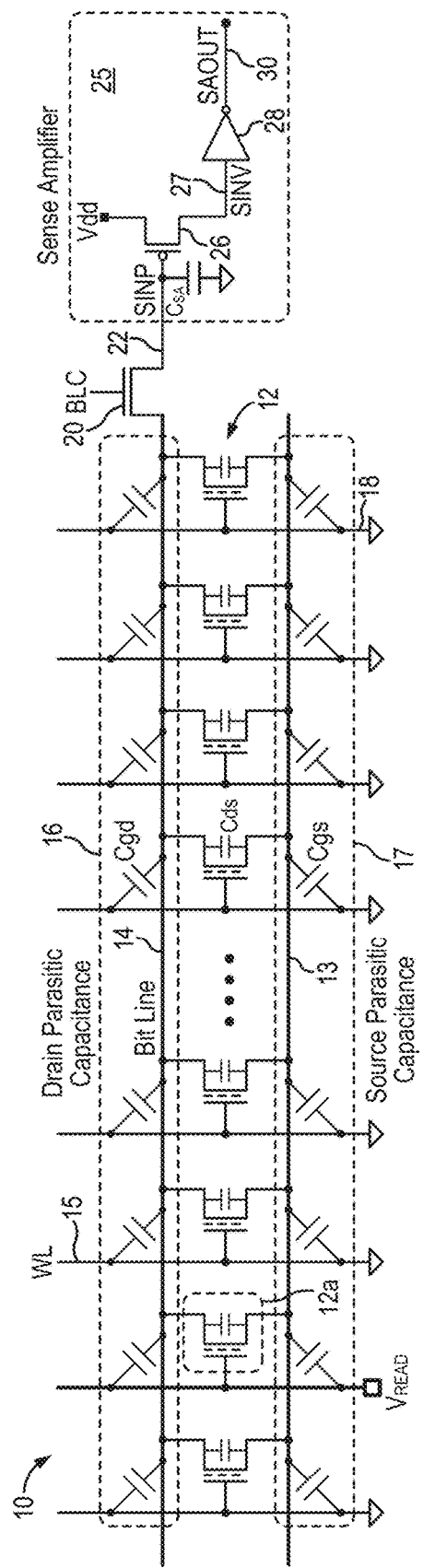
FIG. 1 illustrates a string of storage transistors in a semiconductor memory device in embodiments of the present disclosure.

FIG. 1 illustrates a string of storage transistors in a semiconductor memory device in embodiments of the present disclosure. Referring to FIG. 1, a string 10 of storage transistors includes multiple thin-film storage transistors 12 that share a common bit line 14 and a common source line 13. Typically, a string of storage transistors includes thousands of the parallel-connected storage transistors. In embodiments of the present disclosure, the string of storage transistors 10 is sometimes referred to as a NOR memory string as the storage transistors are connected in parallel with each other and is described as being arranged in a NOR configuration. FIG. 1 illustrates a single string of storage transistors. The string of storage transistors forms a basic building block from which a two-dimensional or three-dimensional array of storage transistors can be formed. That is, multiple strings of storage transistors can be used to form a two-dimensional array of storage transistors, or a plane of storage transistors. A three-dimensional array of storage transistors can be formed by stacking multiple planes of the two-dimensional array of storage transistors. In the present description, the semiconductor memory device is implemented by an array or arrays of strings of storage transistors and the exact configuration or arrangement of the strings of storage transistors is not critical to the practice of the present invention.

The storage transistors 12 in a string 10 have drain terminals that are connected to the common bit line 14 which is connected to a sense amplifier 25 through a bias device 20. The storage transistors 12 in the string 10 have source terminals that are connected to a common source line 13. The source line 13 is electrically floating, that is, the source line 13 is not connected to any electrical potential. In practice, the source line 13 maintains a relatively constant voltage through certain parasitic capacitance between the source terminals to the ground potential. In the present description, the source line 13 is sometimes referred to as being connect to a virtual ground.

Each storage transistor 12 is a thin film storage transistor including a drain terminal connected to the bit line 14, a source terminal connected to the source line 13, a gate terminal or control terminal connected to a word line 15 and a charge storage film in which data is stored for the storage transistor. As thus constructed, each storage transistor 12 has associated parasitic capacitances. More specifically, each storage transistor 12 has parasitic gate-to-drain capacitance Cgd, parasitic gate-to-source capacitance Cgs, and parasitic drain-to-source capacitance Cds. Because the drain terminals of all the storage transistors 12 in the string 10 are connected to the common bit line 14, the parasitic gate-todrain capacitance Cgd of all of the storage transistors in the string (denoted by dotted box 16) becomes a parasitic capacitance as seen by the bit line 14. In the present description, the parasitic capacitance on bit line 14 is also referred to as the drain parasitic capacitance or the bit line parasitic capacitance. Meanwhile, the source terminals of all the storage transistors 12 in the string 10 are connected to the common source line 13 and the parasitic gate-to-source capacitance Cgs of all of the storage transistors in the string (denoted by dotted box 17) becomes a source parasitic capacitance as seen by the common source line 13.

In operation, one storage transistor (e.g. storage transistor 12a) in the string 10 is selected at a time for access, such as read operation. The word line 15 of the selected storage transistor 12a is driven to a given voltage. For example, for reading from the storage transistor, the word line 15 of the selected storage transistor 12a is driven to a read voltage VREAD. For example, the read voltage $V_{READ}$ may be 2V. All the other word lines 15 in the string 10 are electrically grounded. As a result of the source parasitic capacitance (box 17) between the floating source terminals and the non-selected word lines 15, the common source line 13 is biased capacitively to the ground voltage, or to a virtual ground (denoted as node 18). The selected storage transistor may be a conductive cell (that is, an erased memory cell) or a non-conductive cell (that is, a programmed memory cell). When the storage transistor 12a is selected for access, if the cell is programmed, there is no DC current flowing through the drain and source terminals of the selected storage transistor even if the drain and source have different voltages; however, if the cell is erased, thus conducting, there is DC current between drain and source of the selected storage transistor as long as the drain node 14 of the string and source node 13 of the string have different voltages. Eventually, the drain node 14 and the source node 13 will be shorted together by the conducting cell.

In order to read the stored data from the storage transistor, bit line current sensing is used. In particular, the bit line is biased to a certain voltage level by the bias device 20. In other words, to read the stored data from the selected storage device, the bit line is charged up to a given voltage, sometimes referred to as precharging the bit line. Then the selected storage transistor is allowed to modulate the bit line based on the conductive state of the storage transistor. However, when the bias device 20 is turned on to precharge the bit line 14, the bias device 20 must charge up a large amount of parasitic capacitance (box 16) present on the bit line 14. The parasitic capacitance, in particular the grounded-gate-to-drain capacitance of all of the storage transistors on the string, causes a displacement current to flow when the bit line is being pre-charged. As a result, it takes some settling time for the bit line pre-charging to stabilize, increasing the access time of the read operation. In some cases, methods for shortening the access time of data read out from the storage transistors are desired.

Figure 2:
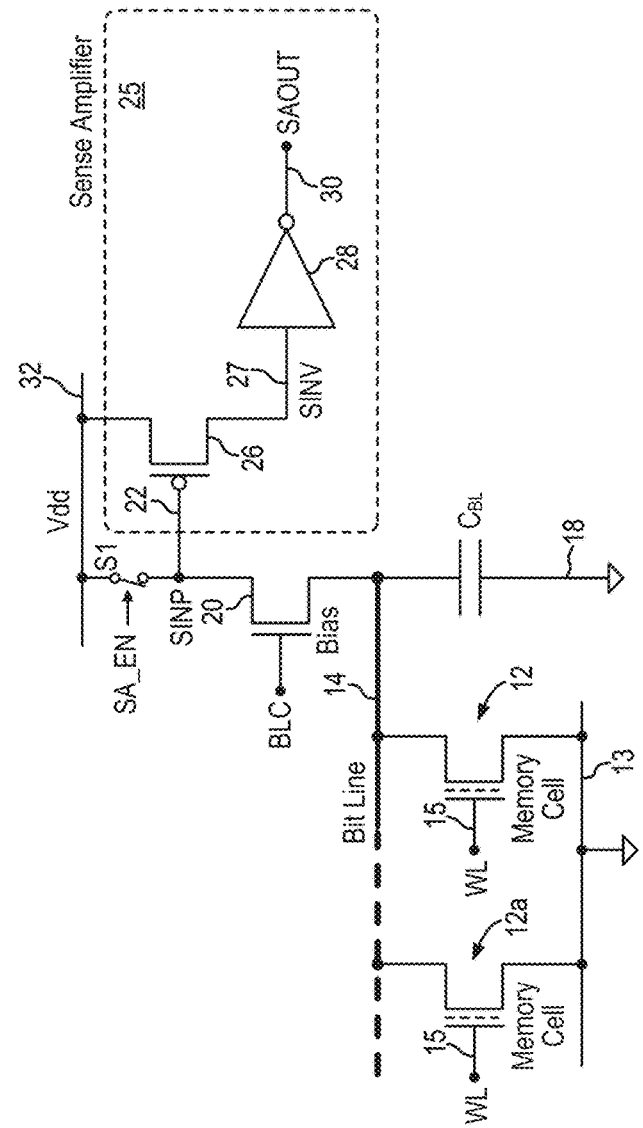
FIG. 2 is a representative circuit diagram of the storage transistors and the associated sense amplifier in embodiments of the present disclosure.

FIG. 2 is a representative circuit diagram of the storage transistors and the associated sense amplifier in embodiments of the present disclosure. Referring to FIG. 2, multiple storage transistors or memory cells 12 are connected in parallel between the bit line 14 and the source line 13 to form a string of storage transistors. In the present illustration, only two storage transistors are shown for simplicity. A capacitor $C_{BL}$ is used to denote the parasitic capacitance on the bit line 14, being the cumulative grounded-gate-to-drain capacitances Cgd of all the storage transistors in the string, as denoted by box 16 in FIG. 1. In a string of storage transistors, because all but one of the word line 15 are grounded, the parasitic capacitance $C_{BL}$ on bit line 14 appears as a capacitance between the bit line and ground, or virtual ground (node 18).

In the present embodiment, a bias device 20 is coupled to precharge the bit line 14. In particular, the bias device 20 is an NMOS transistor and has a drain terminal switchably connected to a positive power supply voltage Vdd (node 32). In the present embodiment, the drain terminal of bias device 20 is connected to the power supply voltage Vdd through a switch S1 controlled by a control signal SA_EN. The bias device 20 has a source terminal connected to the bit line 14. The bias device 20 has a gate terminal or control terminal receiving a bit line control (BLC) voltage. The drain terminal of the bias device 20 is also the sense amplifier input node 22 receiving a sense amplifier input signal SINP. The bias device 20 connects the bit line 14 to a sense amplifier 25. In the present embodiment, the sense amplifier 25 includes a PMOS transistor 26 as an input device. The gate terminal of PMOS transistor 26 is coupled to the sense amplifier input node 22. The PMOS transistor 26 is connected across the positive power supply voltage Vdd (node 32) and an output node 27 providing an intermediate sense signal SINV. The intermediate sense signal SINV is coupled to a buffer 28 to generate the sense amplifier output signal SAOUT (node 30). In the present embodiment, the buffer 28 is an inverting buffer. The sense amplifier output signal SAOUT is therefore inverse of the intermediate sense signal SINV, but in phase with the sense amplifier input signal SINP.

In the present description, the bit line circuit and sense amplifier circuits are illustrative only and not intended to be limiting. In particular, the bit line circuit and sense amplifier circuit are illustrated with only the relevant elements so as not to unnecessarily obscured the invention. In actual implementation, the bit line circuit and the sense amplifier circuit may include other circuit elements and other control signals to facilitate the operation of the sense amplifier and the memory circuit. For example, the bit line may include a discharge transistor to discharge the bit line after a read or write operation. In another example, the sense amplifier circuit may include additional transistors and devices to implement sense amplifier reset functions. Furthermore, the sense amplifier circuit may include a latch circuit for latching the output of the sense amplifier. In the present description, the buffer 28 is sometimes referred to as a second amplification stage and may be configured with additional circuit elements to form a latch circuit for latching the sense amplifier output signal SAOUT.

During a read operation, the switch S1 is closed and the BLC voltage is raised to turn on the bias device 20 to precharge the bit line 14. The precharging of the bit line 14 involves charging the bit line parasitic capacitance $C_{BL}$. Meanwhile, the word line voltage for the storage transistor selected for access is also raised to activate the word line associated with the selected storage transistor. After a given settling time, the control signal SA_EN is deasserted to disconnect the drain terminal of bias device 20 from the power supply voltage Vdd. As a result, the sense amplifier input signal SINP (node 22) senses the current flowing in the bit line 14. In particular, the discharge rate of the voltage at the capacitive node 22 (SINP) is a measure of the current flowing in the bit line. The discharge rate for a conductive cell, where the current includes the cell current plus the residual displacement current of pre-charging the capacitive bit line, is faster than the discharge rate for a non-conductive cell, where the current includes only the displacement current.

Figure 3:
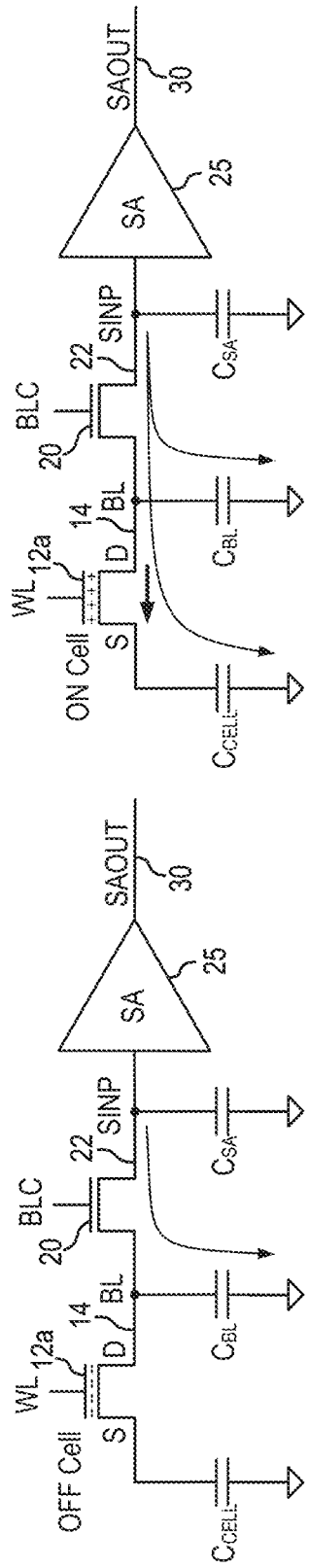
FIG. 3, which includes

FIG. 3, which includes FIG. 3(a) and FIG. 3(b), illustrates further the read operation for a selected storage transistor in the string of storage transistors of FIG. 1 in some embodiments. As a result of the bit line 14 being precharged through the bias device 20 and the sense amplifier input signal SINP (node 22) being disconnected from the power supply voltage Vdd, the sense amplifier 25 is configured to sense current flowing in the bit line 14 through the bias device 20. The selected storage transistor 12a can be a non-conductive memory cell ("off cell") or a conductive memory cell ("on-cell"). That is, a non-conductive memory cell refers to a storage transistor that has been programmed and the threshold voltage for the storage transistor is set to a level higher than the word line voltage $V_{READ}$ so that the storage transistor would not be turned on by the application of the word line voltage $V_{READ}$. A non-conductive memory cell does not conduct cell current when selected. On the other hand, a conductive memory cell refers to a storage transistor that has been erased and the threshold voltage for the storage transistor is set to a level lower than the word line voltage $V_{READ}$ so that the storage transistor would be turned on by the application of the word line voltage $V_{READ}$ A conductive memory cell conducts cell current when selected.

Referring first to FIG. 3(a), in the case the selected storage transistor is a non-conductive cell, the sense amplifier input signal SINP senses the current flowing through the bias device 20 to the bit line parasitic capacitance $C_{BL}$. No or negligible cell current flows through the selected storage transistor 12a. The sense amplifier 25 detects little or no current at the sense amplifier input signal SINP and the sense amplifier output signal SAOUT (node 30) does not change state. On the other hand, referring to FIG. 3(b), in the case the selected storage transistor is a conductive cell, the sense amplifier input signal SINP senses the current flowing through the bias device 20 which includes the cell current flowing through the conductive storage transistor 12a and the current flowing to the bit line parasitic capacitance $C_{BL}$. In other words, the current flowing from the drain terminal of the bias device 20 is shared between the source terminal of the selected storage transistor and the bit line parasitic capacitance. The sense amplifier 25 detects the current flow at the sense amplifier input signal SINP and the sense amplifier output signal SAOUT (node 30) changes state in response. That is, the sense amplifier output signal SAOUT would flip.

FIG. 4, which includes FIGS. 4(a) to 4(c), illustrates in more details the read operation for a selected storage transistor in the string of storage transistors of FIG. 1 in some embodiments. Referring to FIG. 4(a), during the bit line precharge phase, the drain terminal of the bias device 20 (node 22) is connected to the positive power supply voltage Vdd (node 32). The bias device 20 is biased by the BLC voltage and is turned on. The bit line 14 is precharged to a voltage value being a transistor threshold voltage below the power supply voltage Vdd. Because of the bit line parasitic capacitance $C_{BL}$, a displacement current flows in bit line 14 and the charging of the bit line 14 requires a given amount of settling time for the displacement current to dissipate. The settling time extends the read access time for the storage transistor. The read operation has to wait until the displacement current flowing in the parasitic capacitance $C_{BL}$ dissipates before sensing of the bit line current can commence. During the pre-charge phase, the PMOS transistor 26 of the sense amplifier is turned off by biasing the gate terminal (node 22) to the positive power supply voltage Vdd.

After the bit line precharge phase, the sense amplifier input node 22 is disconnected from the power supply voltage Vdd. The sense amplifier input device PMOS transistor 26 is then engaged to sense the current flow on the bit line 14. Referring to FIG. 4(b), in the case the selected storage transistor 12 is a non-conductive cell, the sense amplifier input signal SINP (node 22) senses the current IN flowing through the bias device 20 to the bit line parasitic capacitance $C_{BL}$. Because no or negligible cell current flows through the selected storage transistors, the current flowing in the bit line is predominantly the current $I_C$ flowing into the bit line parasitic capacitance $C_{BL}$, which has settled and is negligible. Therefore, the PMOS transistor 26 remains turned off and the intermediate sense signal SINV is unchanged. For example, the output node 27 of PMOS transistor 26 may generate an intermediate sense signal SINV having a low voltage level, such as near ground.

Referring to FIG. 4(c), in the case the selected storage transistor 12 is a conductive cell, the sense amplifier input signal SINP (node 22) senses the current IN flowing through the bias device 20 which includes the cell current $I_{Cell}$ flowing through the conductive storage transistor and the current $I_C$ flowing to the bit line parasitic capacitance $C_{BL}$. The displacement current $I_C$ flowing to the bit line parasitic capacitance $C_{BL}$ dissipates and the sense amplifier input signal SINP senses only the cell current $I_{Cell}$ (that is, $I_N = I_{Cell}$). The cell current $I_{Cell}$ brings down the gate-to-source voltage at the PMOS transistor 26 so that PMOS transistor 26 turns on. The intermediate sense signal SINV (node 27) is pull up to the positive power supply voltage Vdd. As a result of the intermediate sense signal SINV changing state, the sense amplifier detects the sensed data and the sense amplifier output signal SAOUT changes state in response. The sense amplifier output signal SAOUT is latched and provided as the read data for the selected storage transistors.

In one example, the sense amplifier output signal SAOUT has a first logical state (e.g. logical high) to indicate data value associated with a non-conductive memory cell and a second logical state (e.g. logical low) to indicate data value associated with a conductive memory cell.

In the read operation of the storage transistors, a read access time refers to the time the read command is provided to the time the read data is latched at the sense amplifier output. A short read access time is usually preferred to realize a fast access speed for the memory device thus formed. However, as described above, because of the parasitic capacitance on the bit line of the string of storage transistors, the precharging of the bit line needs a given amount of settling time for the displacement current that flows in the parasitic capacitance to dissipate. The settling time increases the read access time of the storage transistors. In embodiments of the present disclosure, a method to reduce the read access time of the storage transistors implements a voltage step down on the bit line control (BLC) voltage used to control the bias device coupled to the bit line. The BLC voltage step down has the effect of reducing the settling time for the bit line precharge operation, which leads to shortened read access time, as will be described in more detail below.

Figure 5:
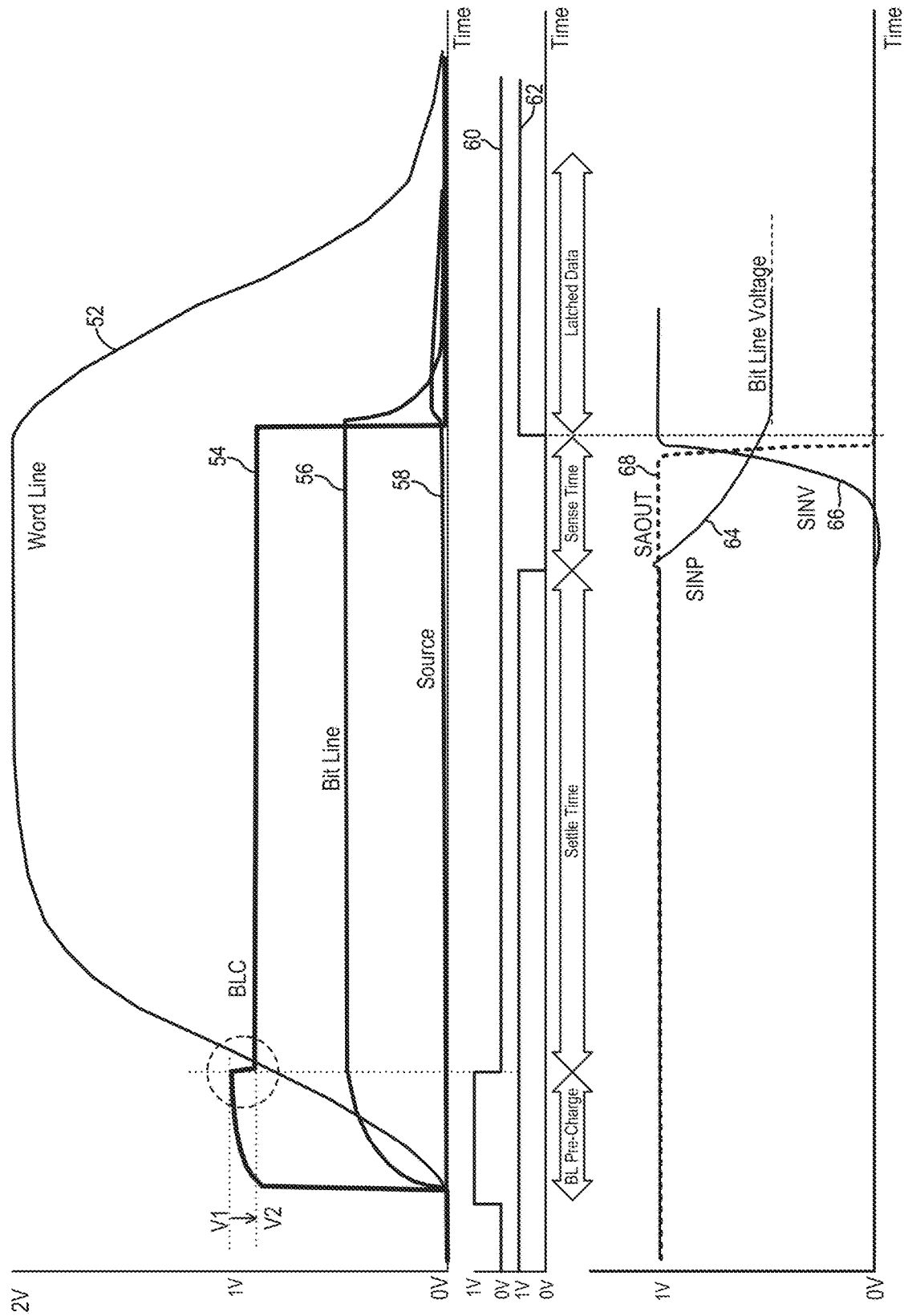
FIG. 5 includes signal waveforms illustrating the read operation for a selected storage transistor in the string of storage transistors of FIG. 1 in some embodiments.

Furthermore, in the sense amplifier operation, the sense amplifier senses the cell current on the bit line to determine the stored data value in the storage transistor. In practice, the sense amplifier does not measure the cell current directly. Instead, the sense amplifier compares the sensed current to a reference current to determine the sensed data value. In some embodiments, the reference current is used to set a time to latch the sense amplifier output signal. However, it is practically impossible to generate reliably a reference current for each of numerous sense amplifiers in a memory device including arrays of strings of storage transistors. A DC current reference is difficult to be accurately reproduced for each sense amplifier or each group of sense amplifiers in the memory device. Using a reference memory cell is also not desirable because the memory cell can lose charge quickly. Finally, using a fixed time duration to latch the sense amplifier output signal is not desirable as the fixed time duration does not compensate for variations within the memory device, such as different leakage level across different storage transistors or variations in the parasitic capacitance on the bit lines. In embodiments of the present disclosure, a method in the memory device to generate a sense amplifier reference current uses a current from a biased but unselected bit line as the sense amplifier reference current, as will be described in more detail below. In this manner, an accurate and reproducible sense amplifier reference current is provided, which also tracks local variations within the memory device, such as manufacturing process variations and variation in leakage currents among the storage transistors FIG. 5 includes signal waveforms illustrating the read operation for a selected storage transistor in the string of storage transistors of FIG. 1 in some embodiments. Furthermore, FIG. 5 illustrates the BLC voltage step down method being applied to shorten the read access time in the memory device in embodiments of the present disclosure. The read operation illustrated in FIG. 5 is described in conjunction with the circuit diagram of the storage transistors and the associated sense amplifier shown in FIG. 2.

Referring to FIG. 5, at the start of the read operation, the bit line control (BLC) voltage (curve 54) is raised to a first voltage (V1) to activate the bias device 20. The bit line pre-charge phase of the read operation is started, and the bit line (curve 56) is charged up from ground to the operation point. In some examples, the bit line is charged up to about 500 mV. At this time, the world line (curve 52) for the selected storage transistor is also activated and is charged up to the voltage VREAD (e.g. 2V) in order to activate the selected storage transistor. The source terminal 13 (curve 58) of the storage transistors are floating but is generally at or near the ground voltage.

After the bit line is precharged, the read operation enters a settle time phase to wait for the signals in the circuit to settle down. In particular, the read operation waits for the displacement current created due to the charging of the parasitic capacitance of the bit line to dissipate. Furthermore, the settle time phase allows the bit line to develop according to the conductive or non-conductive state of the selected storage transistor.

At the end of the settling time phase, the drain of the bias device is disconnected from the positive power supply voltage Vdd and the sense amplifier input signal SINP (curve 64) can start sensing the bit line current. In the present illustration, the selected storage transistor is assumed to be a conductive memory cell. Therefore, as the sensing phase starts, the sense amplifier input signal SINP senses the cell current flowing in the selected storage transistors. As a result of the cell current flowing in the bit line, the voltage level of the sense amplifier input signal SINP (curve 64) decreases. The PMOS transistor 26 is turned on and the intermediate sense signal SINV (curve 66) is charged up to the positive power supply voltage Vdd. The increasing voltage on the intermediate sense signal SINV eventually triggers the buffer 28 in the sense amplifier 25 and the sense amplifier output signal SAOUT (curves 68) is flipped to a low voltage value (or a logical low level). At the end of the sensing phase, a sense amplifier latch window is open and at the end of the latch window, the voltage value of the sense amplifier output signal SAOUT is latched as the read out data of the selected storage transistor. In some examples, the end of the sense amplifier latch window is determined by a sense amplifier data latch signal.

In order to shorten the read access time, a BLC voltage kick-down method is implemented in the read operation. As shown in FIG. 5, the BLC voltage (curve 54) coupled to drive the gate terminal of the bias device 20, is initially driving to a voltage V1 to quickly charge up the bit line voltage. After a given time duration, the BLC voltage is stepped down to a lower voltage V2. The lowering of the BLC voltage, the gate voltage at the bias device 20, has the effect of reducing the displacement current flowing in the bit line, thereby shorting the settling time necessary for the displacement current to dissipate.

Figure 6:
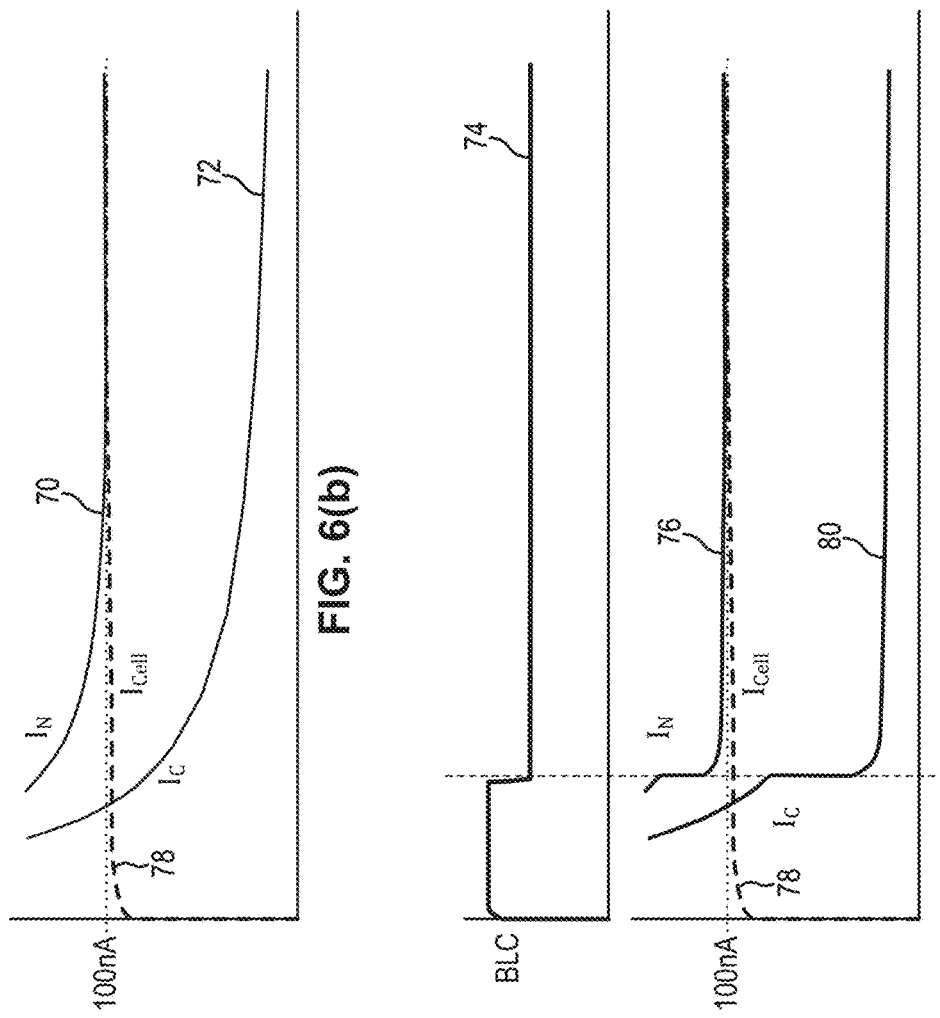
FIG. 6, which includes
Figure 6:
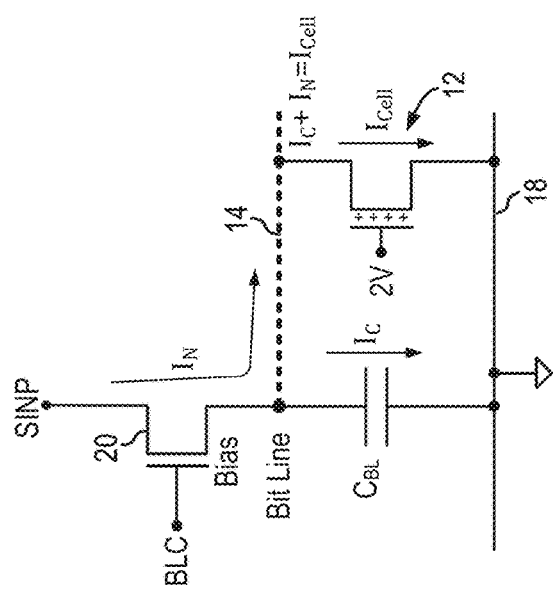

FIG. 6, which includes FIGS. 6(a) to 6(c), illustrates the circuit diagram and the signal waveforms for the BLC voltage kick down method in embodiments of the present disclosure. Referring to FIG. 6(a), as described above, the BLC voltage is coupled to drive the bias device 20 to precharge the bit line 14. FIG. 6(b) illustrates the case when no BLC voltage kick down is applied. In that case, the current $I_C$ (curve 72), being the displacement current flowing through the bit line parasitic capacitance $C_{BL}$, takes a given amount of time to dissipate. As a result, the current $I_N$ (curve 70) flowing through the bias device 20, and being sensed as the sense amplifier input signal SINP, takes a given amount of time to settle to the cell current $I_{Cell}$ (curve 78) being conducted through the selected storage transistor (assuming a conductive memory cell). In the present example, the cell current is around 100 nA.

Referring to FIG. 6(c), according to embodiments of the present disclosure, the BLC voltage (curve 74) implements a step-down of the voltage value after the bit line is charged up. The step-down of the BLC voltage results in a reduction in the displacement current $I_C$ (curve 80). As a result, the current $I_N$ (curve 76) flowing through the bias device 20 can settle to the cell current $I_{Cell}$ (curve 78) more quickly. With the kick-down of the BLC voltage, the displacement current flowing in the bit line parasitic capacitance is reduced and the settling time for the bit line can be reduced so that the read access time can be reduced.

In some embodiments, the BLC voltage driving the bias device 20 has a first voltage level being the positive power supply voltage Vdd and a second voltage level being a calibrated kick-down voltage. In some embodiments, the calibrated kick-down voltage is selected so that a desired amount of displacement current is generated which can be used as the sense amplifier reference current, as will be described in more detail below.

FIG. 7, which includes FIGS. 7(a) and 7(b), illustrates one method of applying the BLC voltage kick down in embodiments of the present disclosure. Referring to FIG. 7(a), in one example, the gate terminal (node 90) of the bias device 20 can be biased by two power supplies implemented as capacitor-connected transistors. The first power supply provides the first voltage V1. For example, the first voltage V1 is the power supply voltage Vdd. Meanwhile, a second power supply is being precharged to a voltage Vx between the Vdd voltage and the gate terminal (node 90). At the end of the precharge phase, the second power supply Vx is switched to connect in parallel with the first power supply V1. As a result, the voltage at the gate terminal (node 90) of the bias device is reduced by a ΔV amount, resulting in stepped down voltage of V2. The method of BLC voltage kick shown in FIG. 7 is illustrative only and not intended to be limiting. Other schemes for implementing the BLC voltage kick down can be used. The BLC voltage kick down method of the present disclosure can be implemented using any applicable methods.

In other embodiments, a bank of capacitor-connected transistors can be coupled to the gate terminal of the bias device to be selectively connected to the gate terminal to realize the desired BLC voltage levels.

FIG. 8 is a circuit diagram of a calibration circuit which can be used to calibrate the BLC kick down voltage amplitude in embodiments of the present disclosure. Referring to FIG. 8, the desired BLC kick down voltage can be selected by a calibration process using the displacement current flowing on a bit line. In the present embodiment, the BLC kick down voltage is selected by searching for the displacement current that would flip the sense amplifier output at a target time. In particular, as explained above, the BLC voltage determines the amount of displacement current flowing in the bit line as a result of the bit line parasitic capacitance. The calibration circuit starts with the BLC voltage at an initial voltage value, which results in a certain amount of displacement current flowing in the bit line 14. The bit line current is coupled to a sense amplifier 25. The sense amplifier output signals SAOUT (node 30) is coupled to a comparator 102 to be compared with a target time Timer 1 (node 104). The comparator 102 generates an output signal (node 106) having a first logical state BLC_Up indicating increasing the BLC voltage level or a second logical state BLC_Down indicating decreasing the BLC voltage level. As thus configured, the BLC voltage that generates a displacement current that would cause the sense amplifier to flip the output signal SAOUT at the target time Timer 1 is obtained. The output signal of comparator 102 is coupled to a digital-to-analog converter (DAC) 108 to generate the output voltage VBLC-KD (node 110). The VBLC-KD voltage can be provided to each bit line to use as the calibrated BLC kick down voltage value.

In some embodiments, the BLC voltage is calibrated to generate a displacement current that is half the cell current. In embodiments of the present disclosure, a memory device includes a single calibration circuit and the BLC kick down voltage calibration can be performed once per semiconductor device.

As described above, a sense amplifier circuit senses the bit line current and determines the stored data value of the selected storage transistor. In operation, the sense amplifier uses a reference current to distinguish a conductive memory cell from a non-conductive memory cell. In practice, the reference current determines when the sense amplifier output signal should be latched as the valid output signal.

Figure 9:
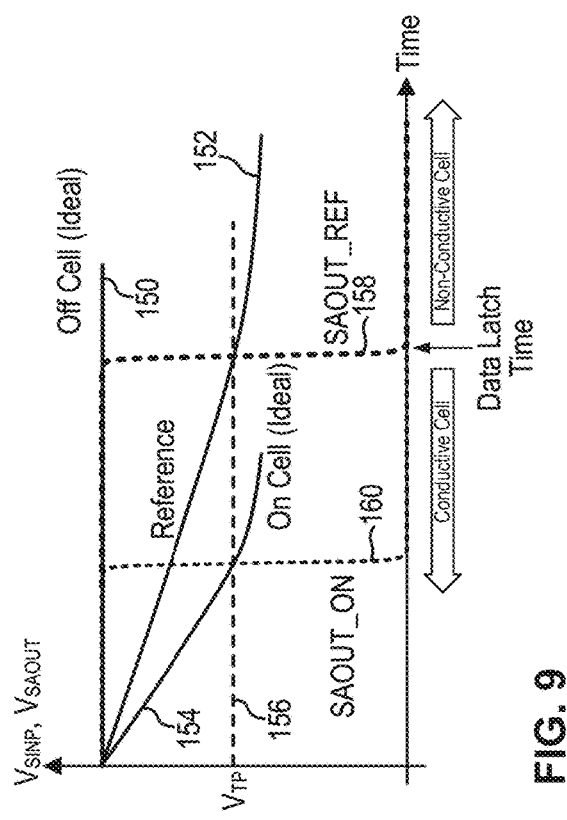
FIG. 9 is a plot illustrating the sense amplifier operation in some examples.

FIG. 9 is a plot illustrating the sense amplifier operation in some examples. Referring to FIG. 9, during the sensing phase of the read operation, the sense amplifier input node senses the current flowing on the bit line and the voltage level of the sense amplifier input signal SINP ($V_{SINP}$) changes in response to the conductive state of the selected storage transistor. In the ideal case, that is, assuming there is no leakage current, there should be no current detected when the selected storage transistor is a non-conductive cell. As a result, the voltage value for the sense amplifier input signal $V_{SINP}$ remains at a high voltage level (e.g. Vdd voltage), as shown by curve 150. Meanwhile, for a conductive cell conducting a given amount of cell current, the voltage value for the sense amplifier input signal $V_{SINP}$ decreases, as shown by curve 154. The sense amplifier has a given trip voltage level, indicated by $V_{TP}$ (curve 156). When the voltage $V_{SINP}$ decreases to the trip voltage level, the sense amplifier output signal SAOUT will change state. For example, the curve 160 illustrates the sense amplifier output signal SAOUT_ON changing state for the conductive cell. In the ideal case, the sense amplifier output signal SAOUT does not change state for the non-conductive cell.

A sense amplifier reference current (curve 152) is used to determine when the sense amplifier output signal SAOUT should be latched. In general, the sense amplifier reference is placed halfway between the conductive cell current value and the non-conductive cell current value to give sufficient margin for the sensing operation. The sense amplifier reference current is associated with a given slope of decrease in the sense amplifier input voltage $V_{SINP}$, which results in the reference sense amplifier output signal SAOUT_REF changing state at a given time (curve 158). The time that the reference sense amplifier output signal SAOUT_REF changes state is used as the data latch time to latch the sense amplifier output signal for the selected storage transistor.

Figure 10:
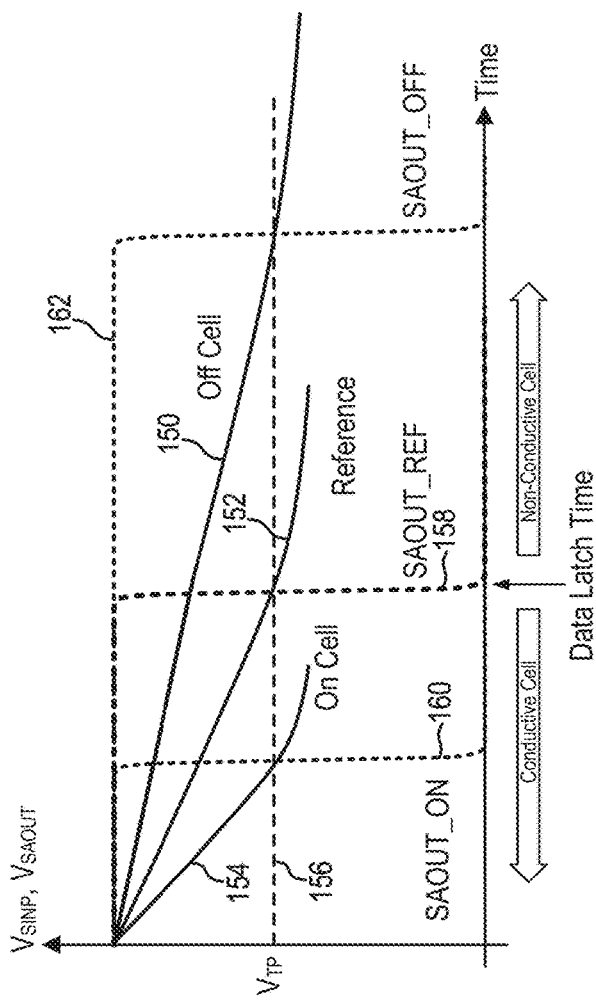
FIG. 10 is a plot illustrating the sense amplifier operation in some examples.

In actuality, the bias device has leakage current and therefore the Off-cell bit current is not zero. FIG. 10 is a plot illustrating the sense amplifier operation in some examples. Referring to FIG. 10, the sense amplifier input voltage $V_{SINP}$ associated with a non-conductive memory cell (curve 150) decreases over time due to leakage current. Thus, given sufficient time, the sense amplifier output signal SAOUT_OFF for the non-conductive cell (curve 162) will change state as well. That is, in practice, the sense amplifier output will flip, sooner or later, regardless of the cell conductivity or lack of it. The more conductive the cell, the faster the sense amplifier output flips. Accordingly, the sense amplifier reference current is instrumental in ensuring the correct read out data is being retrieved by setting the time or the window in which the sense amplifier output signal should be latched. It is desirable that the data latch time be set to give substantially equal margin to the conductive and non-conductive cells by latching the sense amplifier output signal at approximately half time between the ON cell sense amplifier output signal changing state and the OFF cell sense amplifier output signal changing state.

In some examples, the data latch time can be set by a fixed timer. However, a timer is generally undesirable as such a fixed timer cannot take into account the local variations among the thousands of sense amplifiers in the memory device. A fixed timer may not achieve the desired margin for detecting On-cell versus Off-cell in the presence of a leakage current. In other examples, a reference current may be used to set the data latch time. However, it is impractical and impossible to generate an accurate and reproducible reference current for each sense amplifier in the memory device.

In embodiments of the present disclosure, a method in a semiconductor device generates a sense amplifier reference current using a current from a biased but unselected bit line. In particular, the sense amplifier reference current is generated from the displacement current flowing in the biased but unselected bit line due to the bit line parasitic capacitance. In this manner, an accurate sense amplifier reference current that compensates for local variations of the storage transistors, such as leakage currents or bit line parasitic capacitance, is provided to enhance the accuracy of the sense amplifier operation.

Figures 11, 12:
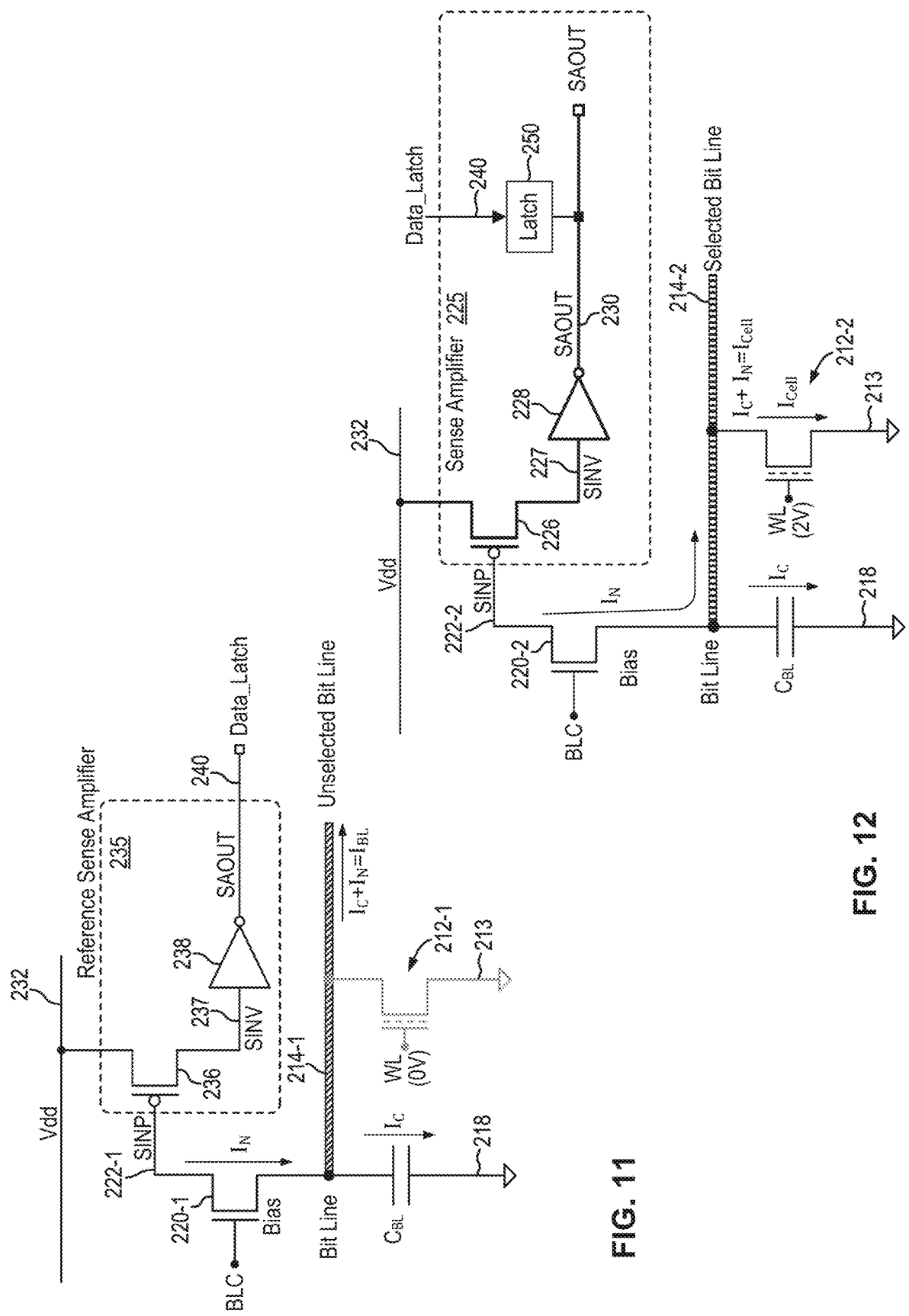
FIG. 11 is a representative circuit diagram illustrating a reference sense amplifier for generating the sense amplifier data latch signal using a biased and unselected bit line in embodiments of the present disclosure.
FIG. 12 is a representative circuit diagram illustrating a standard sense amplifier in a read operation in embodiments of the present disclosure.

FIG. 11 is a representative circuit diagram illustrating a reference sense amplifier for generating the sense amplifier data latch signal using a biased and unselected bit line in embodiments of the present disclosure. Referring to FIG. 11, a reference sense amplifier 235 is provided in a semiconductor memory device for generating the data latch signal (Data_Latch) (node 240). The reference sense amplifier 235 is connected through a bias device 220-1 to a bit line 214-1. In operation, the bit line 214-1 is a bit line that is unselected during the read operation. That is, the bit line is not associated with a storage transistor to be selected for access. For the purpose of illustration, a representative storage transistor 212-1 is shown and the word line voltage is at 0V, indicating the storage transistor is not selected for access. However, the bit line 214-1 is biased by the bias device 220-1. In particular, the bit line 214-1 is precharged to a precharge voltage value, such as a transistor threshold voltage below the power supply voltage Vdd. As thus configured, a displacement current flows in bit line 214-1 due to the bit line parasitic capacitance, denoted by the capacitor $C_{BL}$. The displacement current flowing in bit line 214-1 is sensed by reference sense amplifier 235.

The reference sense amplifier 235 includes an input device 236 implemented as a PMOS transistor. The PMOS transistor 236 has a gate terminal being the sense amplifier input node 222-1 receiving the sense amplifier input signal SINP. The PMOS transistor 236 generates an intermediate sense signal SINV on an output node 237. the sense amplifier 235 further includes a buffer 238 receiving the sense output signal and generating the sense amplifier output signal SAOUT (node 240). In the present embodiment, the buffer 238 is an inverting buffer.

In embodiments of the present disclosure, the reference sense amplifier is constructed using a ratioed input device as compared to the input device in a standard sense amplifier in the memory device. That is, the PMOS transistor 236 is a ratioed PMOS transistor of the input device in the standard sense amplifier. In some embodiments, the PMOS transistor 236 is constructed to have a lighter capacitive load than the input device in the standard sense amplifier. In one embodiment, the PMOS transistor 236 is constructed to have half the input capacitance as the input device in the standard sense amplifier. For example, the PMOS transistor 236 may be constructed having half the transistor width as the PMOS transistor in the standard sense amplifier. In another example, the PMOS transistor of the standard sense amplifier may be constructed using two PMOS transistor devices whereas the PMOS transistor 236 of the reference sense amplifier may be constructed using just one of the PMOS transistor device. Other methods for providing a ratioed input device in the reference sense amplifier may be used.

Figures 13, 14:
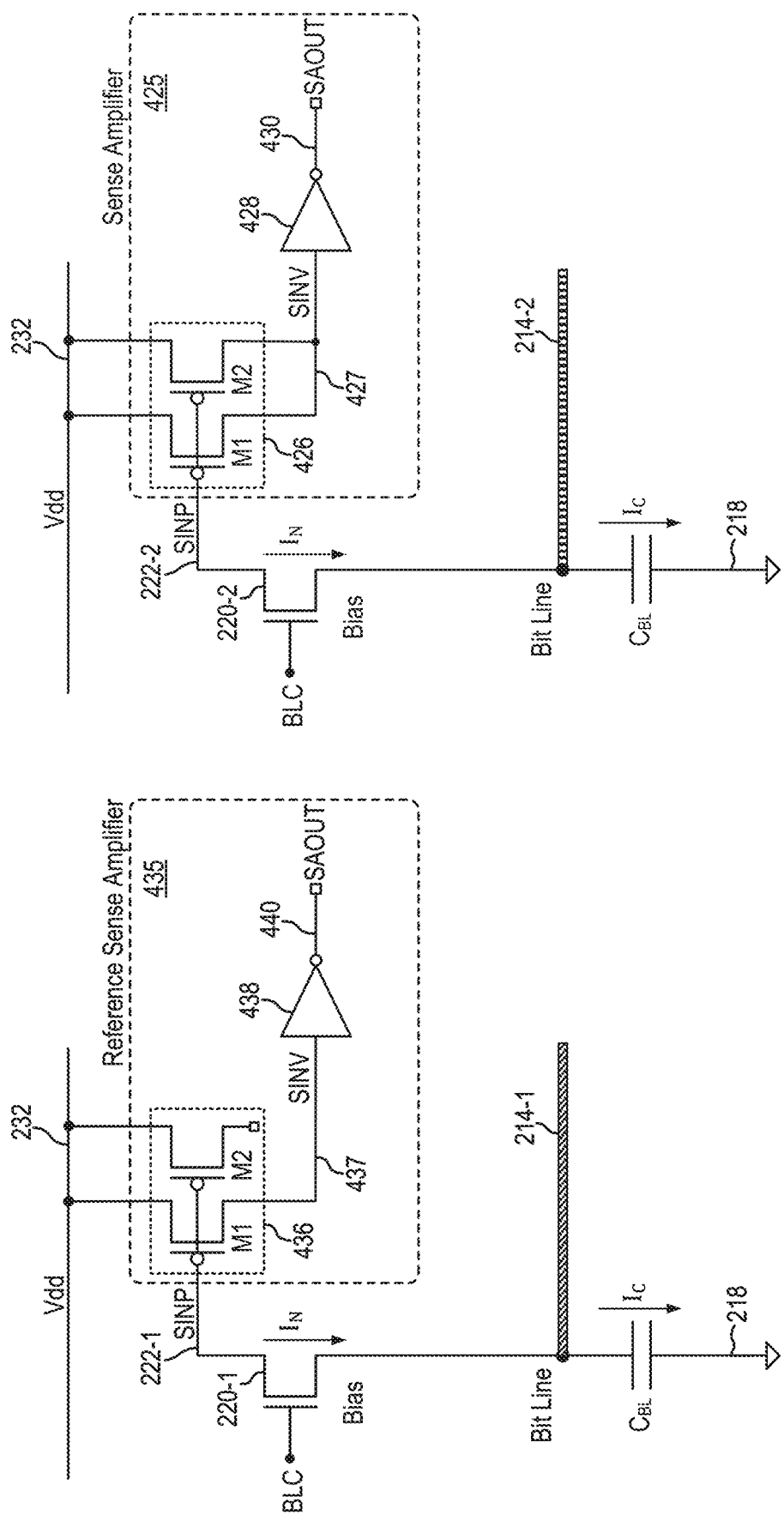
FIGS. 13 and 14 are representative circuit diagrams illustrating a reference sense amplifier and a standard sense amplifier in embodiments of the present disclosure.

In alternate embodiments, the reference sense amplifier can be constructed as a ratioed input device as compared to the input device in a standard sense amplifier by ratioing the conductivity level of the input device. FIGS. 13 and 14 are representative circuit diagrams illustrating a reference sense amplifier and a standard sense amplifier in embodiments of the present disclosure. Referring to FIGS. 13 and 14, a standard sense amplifier 425 includes an input device 426 constructed using two PMOS transistor devices M1 and M2 connected in parallel between the positive power supply voltage 232 and the intermediate sense node 427. Meanwhile, the reference sense amplifier 435 includes an input device 436 constructed in the same manner as input device 426 and including two PMOS transistor devices M1 and M2 connected in parallel between the positive power supply voltage 232 and the intermediate sense node 437. However, for the reference sense amplifier 435, the drain terminal of one of the PMOS transistors, for example, transistor M2, is left floating or unconnected. In this manner, the conductivity level of the input device 436 of the reference sense amplifier is reduced as compared to the conductivity level of the input device 426 of the standard sense amplifier.

Figures 17, 18:
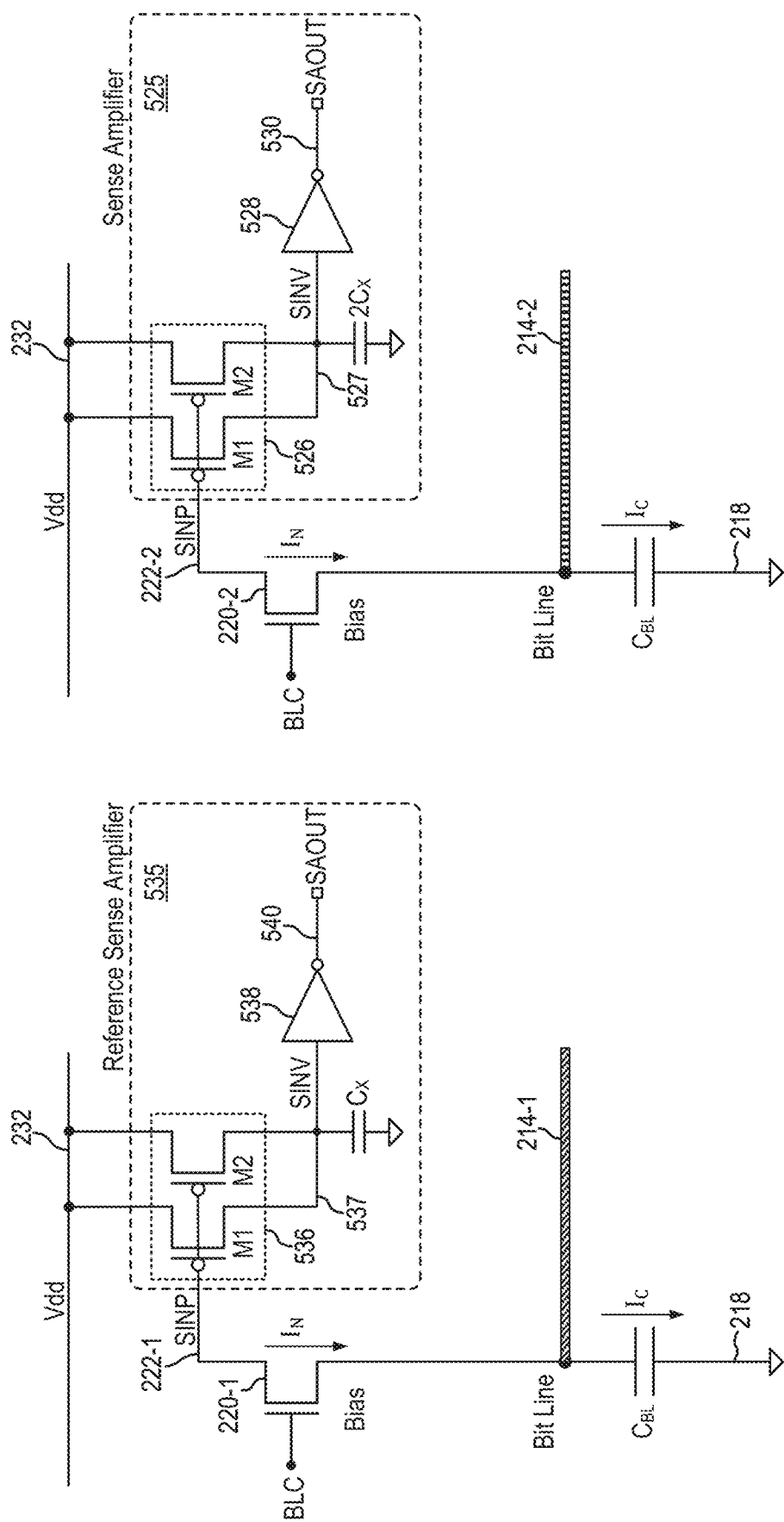
FIGS. 17 and 18 are representative circuit diagrams illustrating a reference sense amplifier and a standard sense amplifier in alternate embodiments of the present disclosure.

In further alternate embodiments, the reference sense amplifier can be constructed as a ratioed input device as compared to the input device in a standard sense amplifier by varying the capacitive load at the intermediate sense node (signal SINV). FIGS. 17 and 18 are representative circuit diagrams illustrating a reference sense amplifier and a standard sense amplifier in alternate embodiments of the present disclosure. Referring to FIGS. 17 and 18, a standard sense amplifier 525 and a reference sense amplifier 535 are constructed using the same input device structure. For example, the input device 526 of the standard sense amplifier 525 and the input device 536 of the reference sense amplifier 535 are both constructed using two parallel connected PMOS transistors M1 and M2. In the present embodiment, the capacitive loading at the intermediate sense node 527 (SINV) of the standard sense amplifier is made heavier or greater than the capacitance loading at the intermediate sense node 537 (SINV) of the reference sense amplifier 535. In some embodiments, a capacitive load $C_X$ is coupled to the intermediate sense node 537 of the reference sense amplifier 535 and a capacitive load greater than $C_X$ is coupled to the intermediate sense node 527 of the standard sense amplifier 525. In the present embodiment, the capacitive load at the intermediate sense node 527 of the standard sense amplifier 525 is made to be $2C_X$, that is, two times the capacitive load at the intermediate sense node 537 of the reference sense amplifier 535. In practice, the capacitive loading at the intermediate sense nodes of the reference sense amplifier and the standard sense amplifier can be adjusted in fine increments to obtain the desired capacitive load ratio to set the desired trip point for the reference sense amplifier versus the standard sense amplifier. In the present illustration, the capacitive loading at the intermediate sense nodes of the reference sense amplifier and the standard sense amplifier has a 1:2 ratio. This ratio is illustrative only and not intended to be limiting. The capacitive loading ratio is adjusted to obtain the desired trip point for the reference sense amplifier and the standard sense amplifier.

As thus constructed, because of the ratioed input device, for the same amount of bit line current, the voltage decrease at the sense amplifier input node 222-1 of the reference sense amplifier 235 is faster than the voltage decrease at the sense amplifier input node of a standard sense amplifier. Referring to FIG. 10, by using a ratioed input device in the reference sense amplifier 235, the sense amplifier input signal voltage $V_{SINP}$ (curve 152) for the reference current would decrease faster than the sense amplifier input signal voltage $V_{SINP}$ for a bit line with a non-conductive storage transistor (Off Cell) (curve 150).

Returning to FIG. 11, as a result of the reference current detected by the PMOS transistor 236, the sense amplifier input signal SINP at the input node 222-1 decreases in voltage, causing the intermediate sense signal SINV (node 237) to increase in voltage. At a given point, the intermediate sense signal SINV will trigger the buffer 238 and the sense amplifier output signal SAOUT (node 240) will change state. The sense amplifier output signal SAOUT (node 240) is used as the data latch signal for the other sense amplifier in the memory device. In this manner, an accurate and reproducible reference current is generated using the displacement current in an unselected bit line and a reliable data latch signal can be generated. Importantly, the reference sense amplifier can be provided for a group, a section or a bank of storage transistors so that local variations among the storage transistors can be accounted for in the reference current.

FIG. 12 is a representative circuit diagram illustrating a standard sense amplifier in a read operation in embodiments of the present disclosure. Referring to FIG. 12, in a read operation, the bit line 214-2 associated with the selected storage transistor 212-2 is biased by the bias device 220-2 and precharged. The selected storage transistor 212-2 is activated for access by the word line being biased to the voltage $V_{READ}$ (e.g. 2V). The sense amplifier 225 senses the bit line current at the start of the sense phase. The sense amplifier input signal SINP (node 222-2) senses the current $I_N$ flowing in the bit line 214-2, which includes the cell current $I_{Cell}$ and any displacement current $I_C$ flowing in the parasitic capacitance $C_{BL}$. In response to the conductive state of the selected memory device, the sense amplifier input signal SINP may decrease at a faster rate (conductive cell) or slower rate (non-conductive cell). The intermediate sense signal SINV (node 227) converts the small signal changes on the sense amplifier input signal SINP to a large signal change. The intermediate sense signal SINV (node 227) will increase faster (conductive cell) or slower (non-conductive cell) in response to the sense amplifier input signal SINP. The buffer 228 generates the sense amplifier output signal SAOUT (node 230) in response. The sense amplifier output signal SAOUT will change state sooner for a conductive cell and later for a non-conductive cell. In the present embodiment, the intermediate sense signal SINV (node 227) is inverse of the sense amplifier input signal SINP and the sense amplifier output signal SAOUT is in phase with the sense amplifier input signal SINP.

The output node 230 of the sense amplifier 225 is coupled to a latch 250. The latch 250 is triggered by the data latch signal (node 240) generated by the reference sense amplifier 235 to latch the sense amplifier output signal SAOUT on output node 230. As presently configured, the sense amplifier reference current should cause the reference sense amplifier 235 to change state at a time half-way between the time where the standard sense amplifier for a conductive cell and the standard sense amplifier for a non-conductive cell would change state. Accordingly, the data latch signal (node 240) will be asserted sometime halfway between the sense amplifier output signal SAOUT changing state for a conductive cell and for a non-conductive cell. In this manner, when the data latch signal 240 is activated to latch the sense amplifier output signal SAOUT on node 230, the data latch signal can ensure that the correct read data is being latched and that there is sufficient margin for detecting a conductive cell versus a non-conductive cell.

In embodiments of the present disclosure, the data latch signal is used as strobe or is used to set a strobe window for latching the sense amplifier output signal SAOUT. In some embodiments, the data latch signal is used to indicate the close of the strobe window and the time when the sense amplifier output signal SAOUT should be latched.

Figure 15:
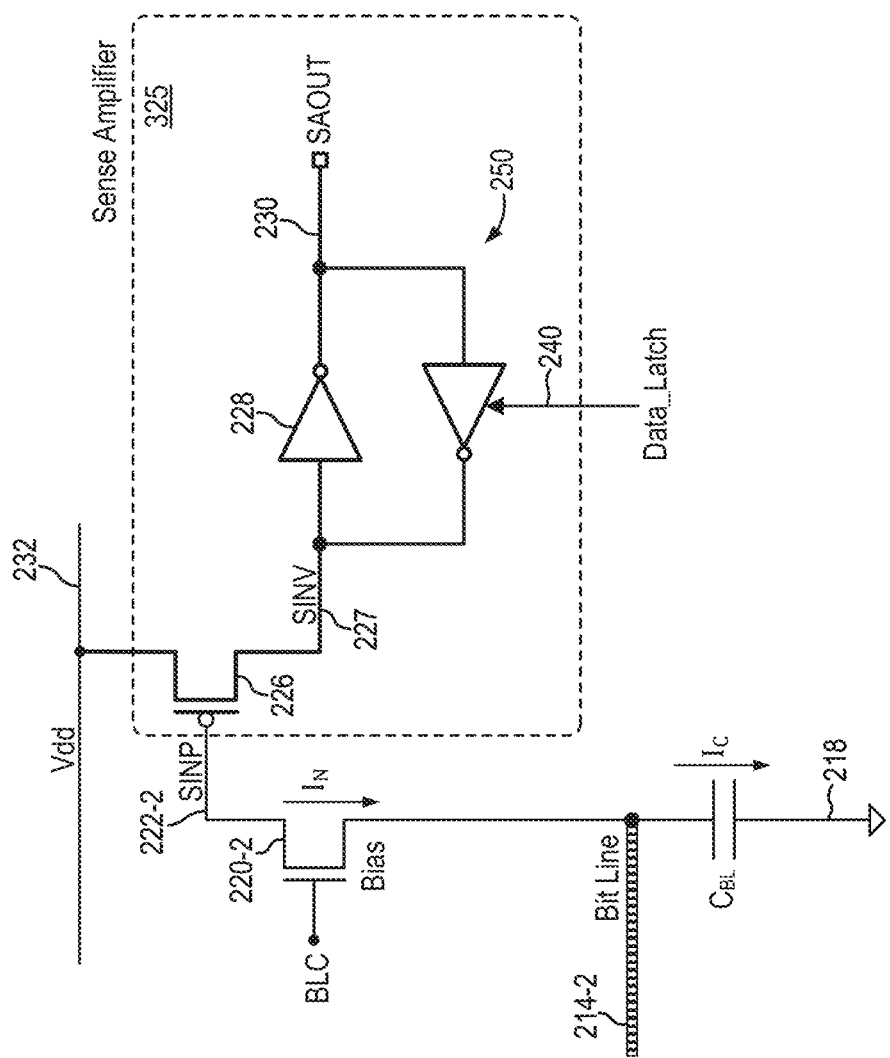
FIG. 15 is a circuit diagram illustrating a sense amplifier including a latch circuit in embodiments of the present disclosure.

FIG. 15 is a circuit diagram illustrating a sense amplifier including a latch circuit in embodiments of the present disclosure. FIG. 15 illustrates one method for latching the sense amplifier output signal SAOUT using a pair of back-to-back connected inverters. Referring to FIG. 15, a sense amplifier 325 includes an input device 226 coupled to the sense node 222-2 for sensing the current flowing in a bit line 214-2 of a string of storage transistors as the sense amplifier input signal SINP. In the present illustration, the input device 226 is a PMOS transistor. The PMOS transistor 226 generates an intermediate sense signal SINV at the drain terminal (node 227). The intermediate sense signal SINV is coupled to a pair of back-to-back connected inverters 228 and 229. That is, the intermediate sense signal SINV is coupled to the input node of inverter 228 and the output node 230 of inverter 228 provides the sense amplifier output signal SAOUT. The output node 230 of inverter 228 is coupled to the input node of the inverter 229. The output node of inverter 229 is connected to the input node 227 of the inverter 228. The inverter 229 is enabled by the data latch signal (node 240). As thus configured, when the inverter 229 is disenabled, the sense amplifier output signal SAOUT is the inverse of the intermediate sense signal SINV and in phase with the sense amplifier input signal SINP. That is, the sense amplifier output signal SAOUT changes in response to the sense amplifier input signal SINP. When the data latch signal (node 240) is asserted to enable inverter 229, the loop formed by the back-to-back inverters 228 and 229 is closed and the inverter 229 drives the input node to inverter 228 with the sense amplifier output signal SAOUT. In this manner, the sense amplifier output signal SAOUT is latched in response to the data latch signal.

Figure 16:
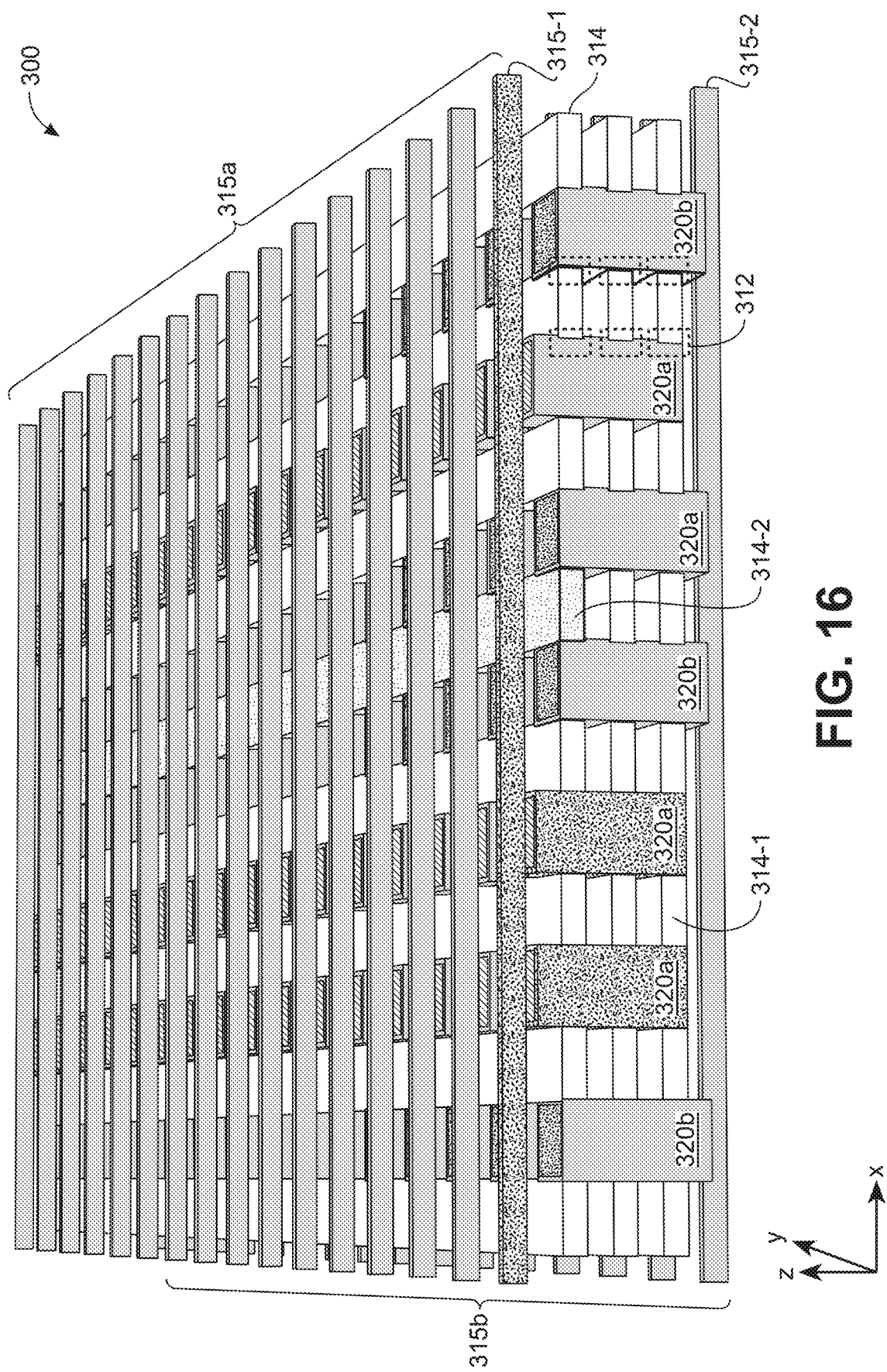
FIG. 16 illustrates a memory device including a three-dimensional array of storage transistors configured to include an unselected bit line for generating the sense amplifier reference current in embodiments of the present disclosure.

In embodiments of the present disclosure, the bit line 214-1 used by the reference sense amplifier to generate the reference current can be a dedicated bit line configured specifically for generating the sense amplifier reference current. Various methods for providing a dedicated bit line in an array of strings of storage transistors are possible. FIG. 16 illustrates a memory device including a three-dimensional array of storage transistors configured to include an unselected bit line for generating the sense amplifier reference current in embodiments of the present disclosure. Referring to FIG. 16, a memory device 300 includes a three-dimensional array of strings of storage transistors. Each string of storage transistors is associated with a bit line 314 extending in a first direction (Y-direction). Multiple stings of storage transistors are arranged in parallel in a second direction (X-direction) to form a plane of storage transistors. Multiple planes of storage transistors are arranged in parallel in a third direction (Z-direction) to form the three-dimensional array of storage transistors.

Storage transistors 312 are formed along each bit line 314. In the present configuration, storage transistors 312 are formed on both sides of a common bit line 314, at the intersection of a bit line 314 and a local word line 320, as indicated by the dotted boxes in FIG. 16. The storage transistors 312 are accessed by global word lines 315a and 315b that are provided above and below the array and extend in the second direction (X-direction) across the strings of storage transistors. Local word lines 320a and 320b extend in the third direction (Z-direction) to connect the global word lines to the storage transistors across the multiple planes. In the present embodiments, a first type of local word lines 320a connects to the global word lines 315a formed on the top of the array and a second type of local word lines 320b connects to the global word lines 315b formed on the bottom of the array.

To select a storage transistor, a global word line (e.g. word line 315-1) is activated. The local word lines 320a associated with the global word line 315-1 are activated to select the storage transistors 312 associated with the local word lines 320a that are electrically connected to the global word line 315-1.

In embodiments of the present disclosure, a dedicated bit line for generating the sense amplifier reference current is created by arranging the local word lines 320a and 320b in such a way that a pair of adjacent local word lines are of the first type and another pair of adjacent local word lines are of the second type. For example, two local word lines 320a are arranged to be adjacent to each other to create a dedicated bit line 314-1. Similarly, two local word lines 320b are arranged to be adjacent to each other to create another dedicated bit line 314-2. In this manner, when a global word line is activated, such as global word line 315-1, the bit line 314-2 remains an unselected bit line without any storage transistor being selected for access. As thus constructed, the bit line 314-2 only has displacement current flowing due to the parasitic capacitance, but no DC current as no storage transistor on the bit line have been selected for access. The bit line 314-2 is connected to a reference sense amplifier to provide the reference current to generate the data latch signal. On the other hand, when a global word line 315-2 on the bottom of the array is activated, the bit line 314-1 remains an unselected bit line without any storage transistor selected for access. Bit line 314-1 is connected to a reference sense amplifier and the displacement current flowing in bit line 314-1 can be used to provide the reference current to generate the data latch signal.

In this detailed description, various embodiments or examples of the present invention may be implemented in numerous ways, including as a process; an apparatus; a system; and a composition of matter. A detailed description of one or more embodiments of the invention is provided above along with accompanying figures that illustrate the principles of the invention. The invention is described in connection with such embodiments, but the invention is not limited to any embodiment. Numerous modifications and variations within the scope of the present invention are possible. The scope of the invention is limited only by the claims and the invention encompasses numerous alternatives, modifications, and equivalents. Numerous specific details are set forth in the description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured. The present invention is defined by the appended claims.

The invention claimed is:

1. A method for sensing data from storage transistors in a memory device being implemented as an array of strings of storage transistors, each string of storage transistors having drain terminals connected to a bit line and source terminals that are floating, the method comprising:
    biasing, using a first bias device, a first bit line associated with a first string of storage transistors to a precharge voltage value, the first bit line being coupled through the first bias device to an input node of a first sense amplifier;
    selecting a storage transistor from the first string of storage transistors for access;
    terminating the precharging of the first bit line;
    in response to the precharging being terminated, sensing, at the input node of the first sense amplifier, a data value of the selected storage transistor;
    generating, at an unselected bit line associated with a second string of storage transistors, a reference current in response to the unselected bit line being biased by a second bias device, the unselected bit line having no storage transistor being selected for access, the reference current being applied to indicate an end of a sensing period; and
    in response to the reference current indicating the end of the sensing period, latching, at an output node of the first sense amplifier, the sensed data value for the selected storage transistor from the first string of storage transistors.

2. The method of claim 1, wherein generating, at the unselected bit line associated with the second string of storage transistors, the reference current in response to the unselected bit line being biased by the second bias device comprises:
    coupling the unselected bit line through the second bias device to an input node of a reference sense amplifier;
    biasing, using the second bias device, the unselected bit line to the precharge voltage value;
    terminating the precharging of the unselected bit line;
    in response to the precharging being terminated, sensing, at the input node of the reference sense amplifier, a data value indicative of a current flowing in the unselected bit line, the current being the reference current; and
    generating a latch signal in response to the reference sense amplifier switching state in response to the sensed data value on the unselected bit line, the latch signal indicating the end of the sensing period.

3. The method of claim 1, wherein generating, at the unselected bit line associated with the second string of storage transistors, the reference current in response to the unselected bit line being biased by the second bias device comprises:
    using a displacement current flowing in the bit line as the reference current, the displacement current being generated as a result of a parasitic capacitance of the bit line being biased by the second bias device.

4. The method of claim 1, wherein the array of strings of storage transistors comprises a plurality of strings of storage transistors organized in parallel in a column direction, each memory cell in the plurality of strings being accessed by a word line extending in a row direction perpendicular to the column direction, memory cells in a row across the plurality of strings of storage transistors being accessed by a pair of word lines, each word line accessing a subset of storage transistors in the row.

5. The method of claim 4, wherein:
    selecting the storage transistor from the first string of storage transistors for access comprises activating a first word line associated with the storage transistor to be selected in the first string of storage transistors, the first word line being coupled to activate a first subset of storage transistors in the plurality of strings of storage transistors in a first row associated with the selected storage transistor, the remaining storage transistors in the first row belonging to a second subset of storage transistors being activated by a second word line; and
    generating, at the unselected bit line associated with the second string of storage transistors, the reference current comprises generating the reference current at the unselected bit line associated with the second string of storage transistors in the plurality of strings of storage transistors, the storage transistor in the first row of the second string belonging to the second subset of storage transistors and not accessed by the activated first word line.

6. The method of claim 5, wherein the array of strings of storage transistors comprises a three-dimensional array of strings of storage transistors, including strings of storage transistors arranged in layers in a third direction orthogonal to both the column and row directions, the pair of word lines including an upper word line formed on a first side of the three-dimensional array and a bottom word line formed on a second side, opposite the first side, of the three-dimensional array.

7. The method of claim 2, wherein coupling the unselected bit line through the second bias device to the input node of the reference sense amplifier comprises:
coupling the unselected bit line through the second bias device to the input node of the reference sense amplifier having reduced input capacitance as compared to the input capacitance of the first sense amplifier.

8. The method of claim 7, wherein the first sense amplifier has an input capacitance of a first value and the reference sense amplifier has an input capacitance of a second value, the second value being half the first value.

9. The method of claim 8, wherein the first sense amplifier comprises an input device formed by a transistor of a first width and the reference sense amplifier comprises an input device formed by a transistor of a second width, the second width being half the first width.

10. The method of claim 2, wherein coupling the unselected bit line through the second bias device to the input node of the reference sense amplifier comprises:
coupling the unselected bit line through the second bias device to the input node of the reference sense amplifier having reduced conductivity as compared to the conductivity of the first sense amplifier.

11. The method of claim 2, wherein coupling the unselected bit line through the second bias device to the input node of the reference sense amplifier comprises:
coupling the unselected bit line through the second bias device to the input node of the reference sense amplifier comprising an input device, an output node of the input device being coupled to a first capacitive load, wherein the first sense amplifier comprises an input device having an output node coupled to a second capacitive load, the second capacitive load being greater than the first capacitive load.

12. The method of claim 2, wherein generating the latch signal in response to the reference sense amplifier switching state in response to the sensed data value on the unselected bit line comprises:
generating the latch signal in response to the reference sense amplifier switching state in response to the sensed data value on the unselected bit line, the latch signal indicating a time half-way between the time the first sense amplifier switching state in response to the sense data value on the selected bit line indicating a conductive cell and the time the first sense amplifier switching state in response to the sense data value on the selected bit line indicating a non-conductive cell.

13. A memory device including an array of strings of storage transistors, each string of storage transistors having drain terminals connected to a bit line and source terminals that are floating, the memory device comprising:
a first bias device having a first current terminal coupled to a first bit line associated with a first string of storage transistors, a second current terminal coupled to a first sense node being switchably connected to a first power supply voltage, and a control terminal receiving a control voltage;
a first sense amplifier having an input node coupled to the first sense node and an output node providing a sense amplifier output signal;
a second bias device having a first current terminal coupled to a second bit line associated with a second string of storage transistors, a second current terminal coupled to a second sense node being switchably connected to the first power supply voltage, and a control terminal receiving the control voltage; and
a second sense amplifier having an input node coupled to the second sense node and an output node providing a data latch signal,
wherein a storage transistor from the first string of storage transistors is selected for access and the first and second bias devices are activated to precharge the first and second bit lines; and after the bit lines are precharged and the second current terminals of the first and second bias devices are disconnected from the first power supply voltage, the second sense amplifier generates the data latch signal in response to a reference current flowing in the second bit line having no storage transistor being selected for access; and wherein the first sense amplifier senses a data value of the selected storage transistor at the first sense node and generates the sense amplifier output signal at the output node at an end of a sensing period indicated by the data latch signal.

14. The memory device of claim 13, further comprising:
a latch having an input node coupled to the output node of the first sense amplifier and an output node coupled to an intermediate node of the first sense amplifier, the latch latching the data at the input terminal in response to the data latch signal, wherein the sense amplifier output signal generated by the first sense amplifier is provided to the latch and being latched in response to the data latch signal.

15. The memory device of claim 13, wherein the second sense amplifier generates the data latch signal in response to a displacement current flowing in the bit line as the reference current, the displacement current being generated as a result of a parasitic capacitance of the bit line being biased by the second bias device.

16. The memory device of claim 13, wherein the array of strings of storage transistors comprises a plurality of strings of storage transistors organized in parallel in a column direction, each memory cell in the plurality of strings being accessed by a word line extending in a row direction perpendicular to the column direction, memory cells in a row across the plurality of strings of storage transistors being accessed by a pair of word lines, each word line accessing a subset of storage transistors in the row.

17. The memory device of claim 16, further comprising:
a first word line coupled to activate a first subset of storage transistors in the plurality of strings of storage transistors in a first row associated with the selected storage transistor and a second word line coupled to activate remaining storage transistors in the first row belonging to a second subset of storage transistors,
wherein the first word line is activated to access the selected storage transistor in the first row of the first string, and the storage transistor in the first row of the second string belongs to the second subset of storage transistors and not selected by the activated first word line; and
wherein the reference current is provided by the unselected second bit line in the second string of storage transistors.

18. The memory device of claim 17, wherein the array of strings of storage transistors comprises a three-dimensional array of strings of storage transistors, including strings of storage transistors arranged in layers in a third direction orthogonal to both the column and row directions, the pair of word lines including an upper word line formed on a first side of the three-dimensional array and a bottom word line formed on a second side, opposite the first side, of the three-dimensional array.

19. The memory device of claim 13, wherein the first sense amplifier has a first input capacitance and the second sense amplifier has a second input capacitance, the second input capacitance being less than the first input capacitance.

20. The memory device of claim 19, wherein the first sense amplifier has an input capacitance of a first value and the second sense amplifier has an input capacitance of a second value, the second value being half the first value.

21. The memory device of claim 19, wherein the first sense amplifier comprises an input device formed by a transistor of a first width and the second sense amplifier comprises the input device formed by a transistor of a second width, the second width being half the first width.

22. The memory device of claim 13, wherein the input node of the first sense amplifier a first conductivity level and the input node of the second sense amplifier has a second conductivity level, the second conductivity level being less than the first conductivity level.

23. The memory device of claim 13, wherein the first sense amplifier comprises an input device having an output node coupled to a first capacitive load, and the second sense amplifier comprises an input device having an output node coupled to a second capacitive load, the second capacitive load being less than the first capacitive load.

24. The memory device of claim 13, wherein the data latch signal indicates a time half-way between the time the first sense amplifier switching state in response to the sense data value on the selected bit line indicating a conductive cell and the time the first sense amplifier switching state in response to the sense data value on the selected bit line indicating a non-conductive cell.

* * * * *